(12) United States Patent
Stierlin et al.

(10) Patent No.: US 6,630,900 B2
(45) Date of Patent: Oct. 7, 2003

(54) PROCESS FOR CARRYING OUT A NON-CONTACT REMOTE INTERROGATION

(75) Inventors: Roland Stierlin, Suhr (CH); Roland Küng, Wolfshausen (CH)

(73) Assignee: Hera Rotterdam B.V., Rotterdan (NL)

( * ) Notice: Subject to any disclaimer, the term of this patent is extended or adjusted under 35 U.S.C. 154(b) by 0 days.

(21) Appl. No.: 10/139,184

(22) Filed: May 3, 2002

(65) Prior Publication Data

US 2002/0140598 A1 Oct. 3, 2002

Related U.S. Application Data

(62) Division of application No. 09/180,409, filed as application No. PCT/EP97/02339 on May 7, 1997, now Pat. No. 6,407,695.

(30) Foreign Application Priority Data

May 7, 1996 (CH) ............................................... 1157/96

(51) Int. Cl.[7] .......................... G01S 13/74; G01S 13/75
(52) U.S. Cl. .............................. 342/51; 342/42; 342/43; 342/44; 342/50; 342/175; 342/195; 342/196
(58) Field of Search ..................... 342/33–40, 42–51, 342/165–175, 194, 195, 196, 200, 201, 202; 333/153, 150–152, 154–164

(56) References Cited

U.S. PATENT DOCUMENTS

| | | | | |
|---|---|---|---|---|
| 3,883,831 A | * | 5/1975 | Williamson et al. | 333/153 |
| 3,981,011 A | * | 9/1976 | Bell, III | 342/44 |
| 4,059,831 A | * | 11/1977 | Epstein | 342/44 |
| 4,096,477 A | * | 6/1978 | Epstein et al. | 342/44 |
| 4,399,441 A | * | 8/1983 | Vaughan et al. | 342/50 |
| 4,725,841 A | * | 2/1988 | Nysen et al. | 342/44 |
| 4,734,698 A | * | 3/1988 | Nysen et al. | 342/174 |
| 4,737,790 A | * | 4/1988 | Skeie et al. | 342/51 |
| 5,469,170 A | * | 11/1995 | Mariani | 342/44 |
| 5,579,008 A | * | 11/1996 | Hulderman et al. | 342/44 |
| 6,407,695 B1 | * | 6/2002 | Stierlin et al. | 342/42 |

* cited by examiner

*Primary Examiner*—Bernarr E. Gregory
(74) *Attorney, Agent, or Firm*—Ohlandt, Greeley, Ruggiero & Perle, LLP; George W. Rauchfuss, Jr.

(57) ABSTRACT

The invention relates to a system suitable for a remote interrogation of passive transponders using chirp signals for interrogation. The transponder preferably has an encoding unit (11), a calibrating unit (12) and a measuring unit (13) each with a plurality of parallel channels (11.1 to 11.5, 12.1 and 13.1 to 13.2). The encoding unit and the calibrating unit are preferably jointly incorporated with a common delay line (14) on the same SAW chip. The interrogation signals received in the transponder via an antenna (10) are delayed characteristically and code-specifically, in particular in the encoding and calibrating unit. Decoding in the interrogation station is preformed by discrete Fourier transformation of the response signal and subsequent evaluation of the spectrum. To correct general disturbing influences on the delay of the response signal, said signal is calibrated using a single calibrating component in the response signal. Calibration occurs by appropriate shift of the spectrum of the stored response signal. For partial correction of individual disturbing influences on the delay of the response signal components, the calibrated response signal undergoes additional correction. If further measuring response signals similar to the identifying and calibrating response signals are produced then they can, for example, be used to measure temperature by appropriate evaluation of the digitally stored response signal. The preferred combination of measuring and encoding unit enables each transponder to be calibrated individually, and consequently, for example, measurement of the absolute temperature.

20 Claims, 11 Drawing Sheets

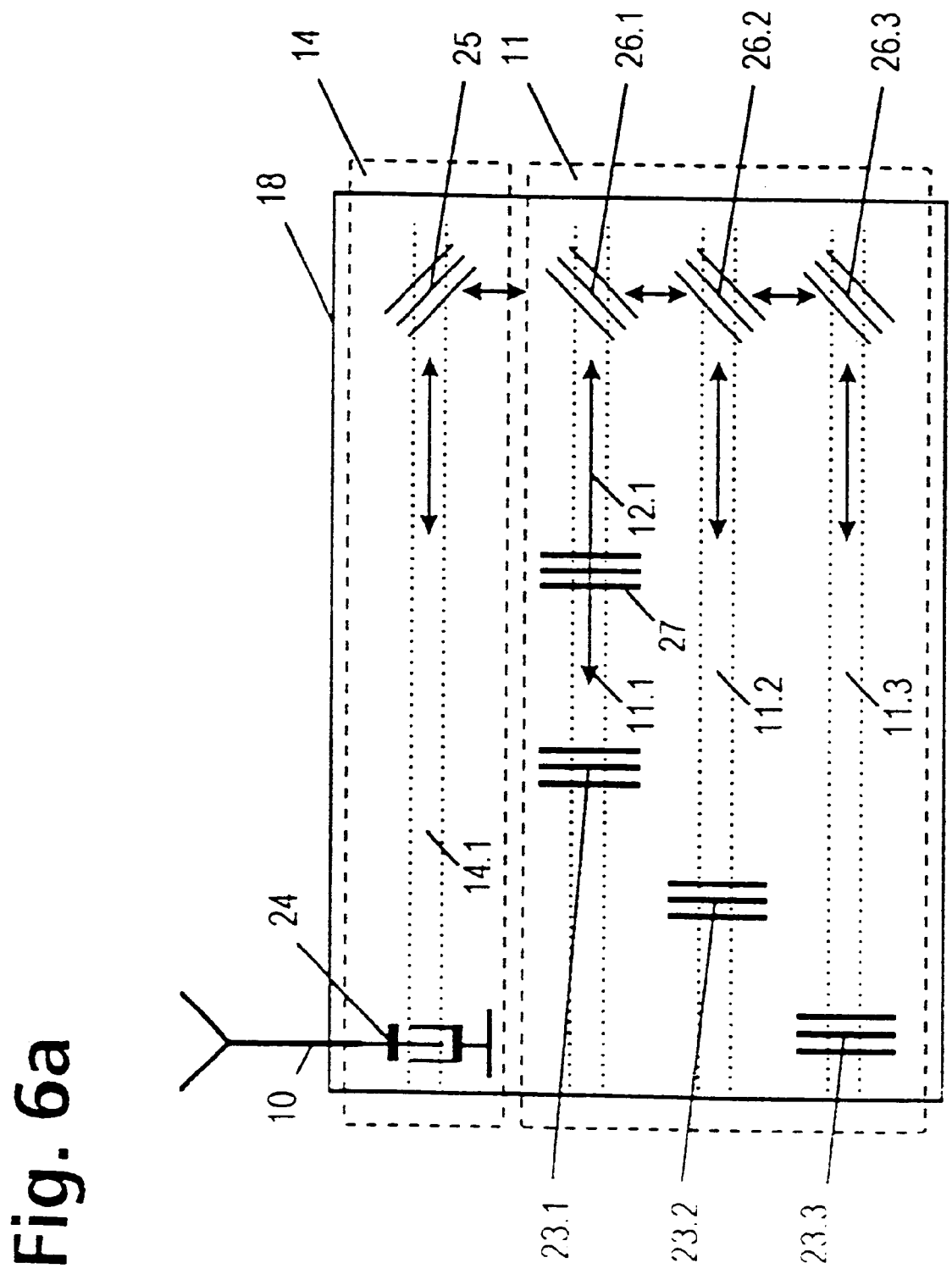

PROCESS FOR CARRYING OUT A NON-CONTACT REMOTE INTERROGATION

RELATED APPLICATION

This application is a divisional application of our application Ser. No. 09/180,409, filed Jan. 4, 1999, now allowed as U.S. Pat. No. 6,407,695, which application is an USA National Stage Application under 35 U.S.C. §371 of PCT Application No. PCT/EP97/02339, filed May 7, 1997, claiming priority from Swiss Application No. 1157/96, filed May 7, 1996.

FIELD OF THE INVENTION

The invention relates to a process for carrying out a non-contact remote interrogation in a system comprising a group of mobile transponders, wherein an interrogation station emits an interrogation signal, said interrogation signal is converted into an information-carrying response signal in a transponder comprising a SAW element and then returned to the interrogation station 1.

The invention furthermore relates to an arrangement for carrying out the process, a transponder for such an arrangement, a SAW element suitable for a transponder and an algorithm for the reduction of disturbing influences on the propagation delay of the response signal.

BACKGROUND TO THE INVENTION

Processes of the above-mentioned kind which describe the identification of transponders are known e.g. from U.S. Pat. Nos. 4,737,790 (Skeie et al., X-Cyte Inc.), 4,734,698 (Nysen et al., X-Cyte Inc.) and 4,096,477 (Epstein et al., Northwestern University). In these processes passive SAW transponders (so-called SAW tags) are identified by means of an interrogation station. The transponders comprise a suitably packaged SAW element (SAW=surface acoustic wave) consisting of a piezoelectric material and suitable antennas for receiving and emitting electromagnetic waves in the range of 905–925 MHz. The SAW element modifies the received interrogation signal and generates a plurality of response signals each having a characteristic propagation. Two different processes are used for encoding the SAW element. The U.S. Pat. No. 4,096,477 uses a SAW element which does not comprise reflectors and on which a binary encoding is realized due to the use or omission of an output transducer. The response signal thus contains a different, code-specific number of signal components. This means, for example, for a code 1000 (binary) that exactly one response signal component is present and for the code 1111 (binary) exactly 4 response signal components. A short pulse is used as the interrogation signal.

In the processes described in the X-Cyte patents, the SAW element modifies additionally the phases of the response signals. The number of response signal components is thereby independent of the realized code; this is an advantage for decoding. The interrogation signal is a so-called chirp signal whose frequency varies in serrations in the range of 905–925 MHz. The SAW element comprises 16 different propagation paths (acoustic encoding channels). As a result, there are 16 different response signals whose signal periods are determined for all SAW elements of the system such that they each differ by one predetermined time interval ΔT. The response signals expanding in the different paths thus have a time cascading which is constant (i.e. equal for all tags). When mixing the interrogation signal with the response signals, a predetermined number of known difference frequencies is generated in the interrogation station.

The difference frequency signals correspond to the beats between the interrogation signals and the time-delayed response signals. They are processed by correspondingly tuned filters. Since in each propagation path of the SAW element attenuation or phase shift elements are incorporated corresponding to the transponder-specific code, the transponder-specific code information can be obtained from the phases or amplitudes of the difference frequency signals.

Temperature changes and production tolerances cause disturbing propagation variations of the response signals. As a result, phase variations occur which distort a decoding or make it more difficult or even impossible. Thus, a calibration process as described in the above-mentioned U.S. Pat. No. 4,734,698 is used in practice. In this process two decoding channels in the transponder must have a uniform, transponder-unspecific code. The difference between the two corresponding response signals is used as the reference for the more exact phase information determination of the other response signals.

The process described above or similar processes have some of the following problems. At a frequency of 2.45 GHz, the phase encoding used is very susceptible to disturbances since already little temperature variations lead to great phase changes. If, for example, lithium niobate (0.7%/ 100° C.) is used as the substrate material for the SAW element, at a temperature change of 100° C. and a relative propagation difference of 100 ns, the relative phase change of the corresponding response signals is about 230° at 905 MHz and about 615° at 2.45 GHz. At 2.45 GHz ambiguity problems arise, or the reflectors must be arranged so close together that resolution problems arise and/or problems concerning the positioning of the phase elements used for encoding.

A further problem results from the described kind of calibration. The use of two response signals having a uniform, transponder-unspecific encoding reduces the number of the response signals usable for identification by 2. In the described embodiment of X-Cyte, the number of independent codes is thus reduced by the factor 4×4=16 as compared to the same system without calibration.

A further problem results from the necessity to optimally separate the response signals and disturbing signals. The disturbing signals are generated outside the transponder (e.g. by reflections of the response signal at metallic objects) as well as inside the transponder (e.g. multiple reflections between transducer (converter) and reflectors in the acoustic channels). It is known that the disturbing internal reflections can be reduced effectively if in the response signal the component having the longest propagation is at least twice as long as the shortest propagation. However, in the known realization of the SAW element and in case there is a large number (e.g. >6) of encoding channels, this prerequisite leads to SAW elements requiring large chip surfaces. A further problem arises from the demand for a cost-saving production of the SAW element. In this connection, the size of the SAW element is an important factor for the cost per article. The smaller this size, the cheaper is the tag. In this connection, the known SAW tags are not satisfactory.

Further problems arise in the process for encoding the SAW elements mentioned in U.S. Pat. No. 4,096,477 in that the number of the response signals to be processed is code-specific, the internal disturbing signals (multiple reflections between the transducers) are strong and numerous and a large number of output transducers is required (e.g. $2^{16}$ codes require 16 output transducers).

A further problem is to convert the incident interrogation signals most efficiently in response signals, i.e. with minimum losses. The better the interrogation signals are reflected by the reflectors, the greater is e.g. the maximum reading distance that can be achieved. Suitable reflectors for this process are e.g. described in U.S. Pat. No. 4,737,790. They operate with a basic frequency of about 915 MHz. The manufacturing of reflectors with a basic frequency of about 2.45 GHz is very difficult with respect to production technology since the width of the electrode fingers is about 0.4 $\mu$m and thus leads to considerable cost disadvantages. The use of reflectors operating on the third harmonic and having a electrode finger width of about 0.6 $\mu$m is known from the prior art e.g. K. Yamanouchi, G. Shimuzu and K. Morishita, "2.5 GHz-range SAW propagation and reflection characteristics and application of passive electronic tag and matched filter", Proc. IEEE Ultrasonics Symposium 1993, pp 1267–1271. The exact width of the electrode fingers particularly depends on the substrate material used. The above indications relate to 128°-LiNbO$_3$.

A further problem results from maximizing the number of possible codes (cost reduction) and, at the same time, the strength of the response signals (long reading distance or safe reading-out in an environment with strong disturbance signals) on a given chip surface.

An effective increase in the response signal strength is achieved if as few acoustic channels as possible are to be realized. As stated in the prior art (V. P. Plessky et al., "SAW Tags: New Ideas", 1995 IEEE Ultrasonics Symposium), an additional loss of 12 dB results if instead of a transducer having 2 acoustic channels a solution with 4 transducers and 8 acoustic channels is realized.

In order to generate a plurality of different codes with a few or even only one acoustic channel, it is advantageous to put several reflectors in the same channel, as can be taken from the prior art (e.g. L. Reindl et al., "Programmable reflectors for Saw-ID-tags", 1993 IEEE Ultrasonic Symposium). If more than one reflector are located in a channel, multiple reflections between the reflectors occur, which multiple reflections may be disturbing particularly if the described position encoding is used. The disturbing influence can be reduced if, for example, for a plurality of reflectors a small reflectivity is selected or if the reflectors are placed at a great distance of each other. Both possibilities lead to a weakening of the response signals of the corresponding reflectors; this is disadvantageous for the identification system and reduces, for example, the maximum reading distance.

BRIEF SUMMARY OF THE INVENTION

It is an object of the invention to provide a process of the above-mentioned kind which allows an identification which is easily realizable and hardly susceptible to disturbances and, additionally, allows a great encoding variety (i.e. a large encoding space) and a good utilization of the chip surface of the SAW element.

The solution according to the invention is defined by the features of claim 1. By combining the position encoding with a calibration, identification can most reliably be performed in particular in case of a large temperature range and a small chip surface. Calibration can in principle be replaced by any kind of measurement (in particular temperature measurement). Even the parallel use of a calibration system and a measuring system is possible.

The interrogation station preferably uses a chirp signal for transponder interrogation. The response signal can be stored as a sampled, digitized time signal and can undergo a discrete Fourier transformation (FFT) for decoding the identifying information. In the frequency domain the propagation differences may be determined and processed more easily. With the realization of the SAW elements according to the invention, an effective elimination of internal disturbing signals and a cost-saving realization of the transponders is achieved.

Encoding leads to a characteristic time delay of at least part of the response signal components. It is an important feature of the process that the number of identifying signal components is independent of the implemented code word. It is identical for all transponders of a specific application. The known matched filter technique is suitable for the determination.

Exactly one response signal component (calibrating response signal) is used to measure the disturbing propagation variations of the basic delay TO and to carry out the correction of the propagations of at least the identifying response signal components. It is an important feature of the new process that the temperature-dependent relative propagation variations among the identifying response signals can be neglected.

The propagations of the identifying response signals are determined such that each signal lies in exactly one predetermined time window (designated A,B,C,D, . . . ). The sum of all time windows is a chain of non-intersecting time intervals. Each time window (enumerated 0,1,2,3, . . . ) is subdivided into predefined time slots known to the system. According to the invention the propagations of the identifying response signals are preset such that the signal, or the center of energy mass of the signal, is located in one of the predefined time slots (designated e.g. A0, i.e. in time slot 0 of time window A). The entirety of used time slots forms a characteristic pattern on the time axis (or in the spectrum), said pattern corresponding to the code number to be read out.

The size of the used time slots depends on the bandwidth of the system, in particular of the interrogation signal. In a preferred embodiment the bandwidth of the system is 40 MHz and the size of the time slots is at least 25 ns. The number of time windows $N_{ZF}$ (e.g. 8) is predetermined by the number of encoding channels or the identifying response signals, respectively. If the number of time slots per time window is $N_{ZS}$ (e.g. 4), the following number N of possible codes results:

$$N = N_{ZS}^{N_{ZF}}, \ (e.g. \ 4^8 = 2^{16}) \tag{1}$$

It is an important advantage of the present invention that a large number of codes can be generated with few transducers and reflectors. In case two encoding channels with one reflector each are used, a total of one transducer and two reflectors is required to realize $2^{16}$ possible codes, if 16 time slots are provided for any one of the two time windows. In known processes (cf. the above-mentioned patents of the company X-Cyte) four transducers and eight reflectors are required for the same number of codes.

For calibrating, a uniform encoding (family code) for all transponders of one application is preset in a coding channel or a separate channel. Thus, all calibrating response signals of one application lie within the same time slot of the same time window. This position is known to the system and can be changed well-defined for each application, e.g. by shifting the calibrating response signal into a different time slot of the same time window. Thus, transponder families having the same code number but a different family code are defined.

Determination of the actual position of the calibrating response signal component in the spectrum of the response signal allows, in combination with the knowledge of the desired position, the approximate determination of the disturbing change of the basic delay TO. These propagation variations are caused by temperature changes in the transponder, by the changing air gap between the transponder and the antenna of the interrogation station, by the varying length of the antenna cable and by aging or temperature changes in the electrical lines between antenna and processing unit of the interrogation station.

Contrary to the calibration known from the prior art, the process according to the invention uses exactly one response signal component for calibration. This response signal component is preferably that component having the shortest propagation. It is separated from the identifying response signal components by an off-time slot having a predetermined duration.

For carrying out the calibration, preferably the sampled and stored response signal (time signal) is weighted with a window function and subsequently undergoes a discrete Fourier transformation and in the resulting spectrum an actual position of the calibrating response signal component is determined and compared with a preset desired position.

The deviation between actual position and desired position leads to a frequency shift $\Delta\omega$ which can be used for calibrating the time signal.

The time signal is multiplied by a function $f(t)=e^{-j\Delta\omega t}$, which leads to a shift of the spectrum into a position adapted to the FFT raster, and stored as a calibrated signal.

The multiplication result is weighted with a suitable window function and undergoes a new discrete Fourier transformation.

In the received spectrum the maxima of the samples are determined in a plurality of or in all frequency windows. Subsequently, it is tested whether the received maximum samples have a sufficient signal-to-noise ratio. If this is the case, the corresponding code is determined. If this is not the case, evaluation is stopped.

In order to enable a reliable determination of the code even in case of long codes and strong temperature influences, the response signal may be divided into a plurality of blocks. These blocks are processed successively, wherein in each block a temperature-dependent propagation or frequency shift is compensated and the corresponding identifying response signal components are evaluated.

In order to further minimize temperature influences and the like when determining the code contained in the identifying response signal components, an additional, merely calculated correction may take place. For this, a temperature-dependent frequency shift $\delta\Delta\omega$ is determined from the spectrum of the calibrated time signal by correlating the positions of all samples being sufficiently close to the calibrating sample with their desired position. ("Sufficiently close to" means that the maximum disturbing influences to be expected can by no means cause an essential shift of the samples taken into consideration in this first block.) The stored and calibrated time signal is subsequently multiplied by a function $f(t)=e^{-j\delta\Delta\omega t}$, weighted with a window function and Fourier transformed. In this way the resulting spectrum is processed successively, wherein, however, in a suitable number of not yet decoded frequency windows the maximum samples are determined and it is tested whether they have a sufficient signal-to-noise ratio, before the corresponding part of the code is determined.

In a further embodiment of the invention a transponder is realized such that in addition to identifying and calibrating response signal components also measuring response signal components are transmitted to the interrogation station. Thus, individually addressed measuring probes and measuring probes which are read out in a non-contact manner can be realized. Particularly the effect of temperature dependency of the signal delay, which is disturbing for the identification, can purposefully be used for temperature measurement. The calibrating response signals can thereby have two functions and are used for calibrating identifying and measuring response signals.

For performing such a measurement, the SAW element generates at least two response signal components for temperature measurement at the place of the transponder. Since the SAW element (which is in this case additionally used as a sensor) can be identified by its code, its individual characteristic values can be stored in the interrogation station. The interrogation station can thus store characteristic values for a plurality of such sensor elements so that a complete evaluation of the incoming response signals is always possible (e.g. determination of the absolute temperature instead of the temperature change only).

In a further embodiment of the invention a transponder is realized such that the interrogation and response signals in the transponder are lead through a common, propagation-increasing signal line being connected upstream or downstream of the encoding channels. The propagation-increasing effect of the common delay line allows a good separation of the response signals from disturbing influences, in particular from disturbing environmental reflections of the interrogation signal. The at least partially common use of the delay line allows a decreasing space-requirement for the SAW element at a constant number of possible codes. Thus, particularly the delay line which, according to the prior art, is present in each individual encoding channel of a SAW tag is replaced and a common additional delay line is purposefully introduced. Thus, the encoding channels connected upstream or downstream can be brought to a minimum length without shortening the entire propagation of the interrogation or response signal in the transponder.

As a rule, common delay lines and encoding channels are formed on one single SAW chip. However, it is also possible to realize the delay line on a separate SAW chip.

Propagation-increasing signal lines different from that for the signal components suitable for calibration and/or measuring purposes can be used for the identifying signal components. It is also possible that only some of the encoding channels are connected to the common delay line.

In order to save chip surface, the calibration channel and one encoding channel can partially overlap, wherein a semitransparent reflector is provided for generating the calibrating or also the encoding response signal component.

In a particularly preferred embodiment, the reflectors are realized such that they operate on the second harmonic. The period of the reflector structure equals the wavelength $\lambda$ of the operating frequency, e.g. 2.45 GHz, and the width of the electrode fingers is about half the period, e.g. about 0.8 $\mu$m at 2.45 GHz and if 128°-LiNbO$_3$ is used as the substrate material.

The function of the reflectors is similarly good for different forms of electrical connections between the individual electrode fingers. For example, all fingers can be short-circuited (FIG. 6d) or open, or connected as pairs of two (FIG. 6e), etc. A connection can be realized on the ends of the fingers or between them, and also combinations thereof are possible.

The use of the reflectors according to the invention leads to considerable advantages as compared to the 3rd harmonic reflectors known from the prior art:

1. The width of the electrode fingers is larger, about 8/6 larger; this makes reproducible manufacturing easier;
2. The reflection coefficient of the individual electrode fingers is essentially higher;
3. A high reflectivity can be achieved with clearly fewer electrode fingers; this is an advantage in connection with surface requirement on the chip and manufacturing costs.

The use of the reflectors according to the invention also leads to considerable advantages as compared to the reflectors known from the prior art and operating on the basic frequency:

1. At 128°-$LiNbO_3$ and an operating frequency of 2.45 GHz the fundamental reflectors require a period (pitch) of about 0.8 µm and an electrode finger width of about 0.4 µm. The cost-saving manufacturing of such structures is difficult and, for example, outside the specification for the i-line steppers used today. In second harmonic reflectors the required period (pitch) doubles and the width of the electrode fingers is now about 0.8 µm. Manufacturing of second harmonic reflectors with today's i-line steppers does thus not cause any problems.
2. In addition, in case of a greater period (pitch) and correspondingly larger distances, electrical breakdowns between the electrode fingers by static or pyroelectric charging effects are less probable.

The present invention describes a reflector which can be used in a transponder and can more easily be manufactured and/or has a higher reflectivity than is known from the prior art.

If reflectors are arranged successively in an acoustic channel, in particular disturbing multiple reflections between the reflectors arise. A disturbing influence results in particular in combination with the described kind of encoding of the transponders by means of position encoding. This is particularly true if the reflectors are located close to each other, e.g. closer than 1 mm, for reasons of space requirements and in order to minimize propagation losses.

The present invention describes a new type of offset reflectors which is suitable particularly for the use in transponders. The offset reflectors result in particular from known reflectors by modifying them in accordance with the invention.

In sum, the use of offset reflectors leads to the following advantages:
1. Successive offset reflectors can be located closer to each other; thus, valuable chip surface can be saved;
2. Successive offset reflectors can generate stronger response signals since they are located closer to each other and thus fewer propagation losses result and they can have a higher reflectivity, without the simple round-trip reflections exerting a disturbing influence;
3. Disturbing multiple reflections which are generated by reflections at the transducer or at the opposite reflector on the other side of the transducer can be attenuated considerably.

In a particularly preferred embodiment second harmonic reflectors are used for the realization of offset reflectors, but all types of reflectors can be modified in accordance with the present invention. If second harmonic offset reflectors are used, in particular for an operating frequency of 2.45 GHz it is advantageous for the manufacturing process that at the end of each half an additional electric connection of the electrode fingers is introduced, which overlap partially or completely in the center of the reflector.

According to the invention, a transponder layout (e.g. FIG. 6c) can be realized with offset reflectors, wherein all reflectors 50.1–7 and 51 contained in the drawing are offset reflectors. As compared to a similar layout with four transducers, eight acoustic channels and one reflector in each channel, the present embodiment comprises only two transducers, four acoustic channels and two offset reflectors in each channel. A reflector 51 is used as a calibrating reflector, wherein it creates the shortest time delay. With the same number of, for example, five time slots per time window (one of them being an off-time slot) and a total of seven time windows, $4^7=16384$ possible codes result for the layout realized in FIG. 6c and a corresponding layout with four transducers.

If only two transducers are used, the strength of the response signals is increased by the factor 4, since when the data carrier receives the interrogation signal, the signal is distributed to two transducers only, and only two instead of four transducers are excited after reflection.

With the layout according to FIG. 6c the surface of the chips 54 can additionally be almost halved with the same number of codes by changing from four transducers with a total of eight normal reflectors to two transducers with eight offset reflectors.

According to the invention, there is a second possibility for realizing the offset reflector 51, i.e. in each of all four acoustic channels 52.1–4 one reflector (offset or not) is located at the same distance from the transducers as 51, however with clearly lower reflectivities. The advantage thereof is that a strong calibration signal is generated by all four reflectors; however, due to the lower reflectivity of the individual reflectors, response signal disturbance by the offset reflectors 50.1–7 is lower than would be the case if only one offset reflector is located in the channel 52.1. The realization of a strong calibration response signal can also be used in cases different from the mentioned one.

In practice, the arrangement according to the invention comprises a plurality of mobile transponders or SAW tags (depending on the application, for example several tens or several ten thousands). Moreover, interrogation stations can be provided on a plurality of places (depending on the respective system demands).

An arrangement for carrying out a non-contact remote interrogation according to the present invention comprises an interrogation station for emitting an interrogation signal and for receiving and evaluating a response signal, at least one mobile transponder having an antenna for receiving the interrogation signal and/or emitting the response signal and a decoding unit having a plurality of parallel encoding channels for converting the interrogation signal into an identifying response signal. According to the invention, in front of or after the at least one encoding unit a propagation-increasing signal line common to the corresponding encoding channels is provided.

If delay line and encoding unit are integrated on the same SAW element, the corresponding structures can be coupled by transducers (finger electrode structures), 90° reflectors (e.g. coupling of two parallel channels by two 90° reflectors aligned with respect to each other) or RMSC structures (RMSC=reversing multistrip coupler). Contrary to the embodiments comprising transducers (in which parasitic reflections of the signal can occur at −15 to −20 dB), the 90° reflectors and the RMSC structures are to a large extent free of disturbing internal reflections.

It is not urgently necessary that the response signal components are generated by, for example, code-specifically positioned reflectors. It can also be the case that a plurality of encoding channels is provided with transducers emitting on one side, wherein transducers received on the emitting side are arranged at code-specific distances, which are connected with the antenna (via electrical lines).

Further preferred embodiments and feature combinations can be taken from the following detailed description and from the complete set of claims.

BRIEF DESCRIPTION OF THE DRAWINGS

The Figures used for explaining the examples show:

FIG. 6a a schematic representation of an encoding unit realized on a SAW element with common delay line, coupling via 90° reflectors and transducers emitting on one side in the encoding channels;

Figure 1:
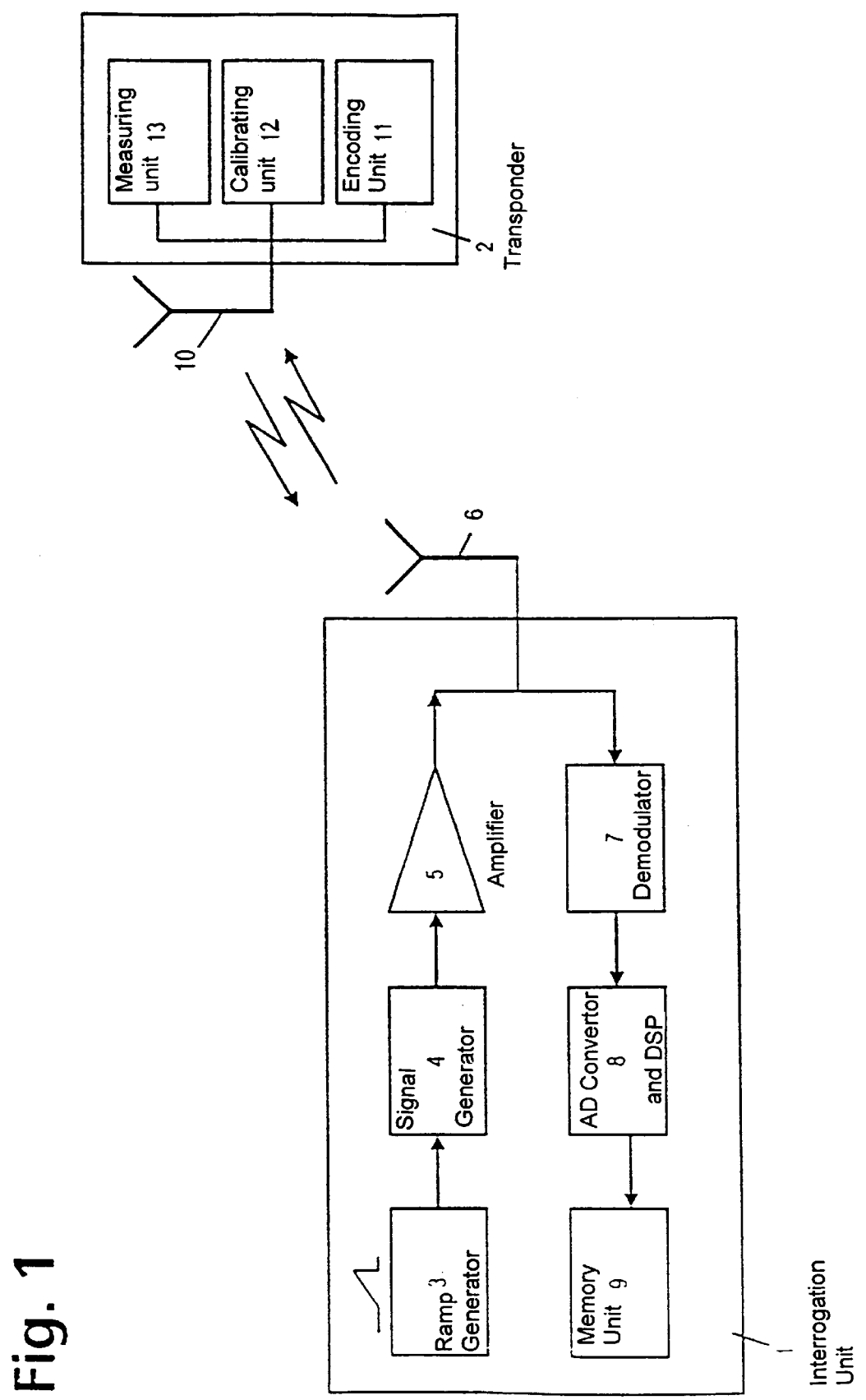
FIG. 1a schematic representation of an arrangement for carrying out a non-contact remote interrogation.

Basically, in the drawings equal parts have equal reference numerals.

DETAILED DESCRIPTION OF THE INVENTION

FIG. 1 shows a rough block diagram of an interrogation station 1 and a transponder 2. The interrogation station 1 constantly emits interrogation signals Q (e.g. chirp or pulse signals) and evaluates received response signals of mobile, closely arranged transponders. The transponder 2 is a passive element having a (preferably integrated) antenna 10, a combination of encoding unit 11, calibrating unit 12 and measuring unit 13 and electrical lines. It is formed, for example, as a flat plate or card and connected to the object to be identified (or at the place of measurement) as a mark (label).

In order to achieve a higher reading distance it is, compared to the emission of a short pulse, advantageous to use a known chirp signal (linear frequency ramp) for transponder interrogation. Such a signal comprises a significantly higher energy, without exceeding the admissible transmitting power. In particular, the frequency domain is more suitable for analyzing signals corresponding to a sum of sinusoidal analysis signals than the time domain.

The interrogation station comprises a ramp generator 3 which, in a preferred embodiment, generates the control signal for the chirp signals with a 40 MHz bandwidth and a duration of $T_{BEOB}=16$ ms. The steepness of the corresponding frequency ramp is thus 2.5 Hz per nanosecond (Hz/ns). The ramp generator 3 feeds a carrier signal generator 4 (VCO) which generates a chirp signal at a center frequency of e.g. 2.44 GHz. The resulting interrogation signal is amplified by an amplifier 5 and emitted via an antenna 6.

After an appropriately selected delay $T_0$ has passed, the response signals of the transponder 2 are received. In the demodulator 7 a low-frequency signal is generated for each component of the response signal by inverse mixing the response signal with the interrogation signal, the frequency of said low-frequency signal being exactly proportional (above-mentioned 2.5 Hz/ns) to the propagation of the corresponding signal component. The characteristic propagations of the individual components of the response signal are converted into proportional frequency distances (based on a suitably selected reference frequency) and can be evaluated in the frequency domain.

Thus, there is a clear representation between frequency domain and time domain; this makes it possible to represent the situation in any desired description. It is particularly suitable for the representation of parts of the invention to select a description in the time period, wherein it is assumed that the interrogation station emits a short pulse instead of a chirp signal and the transponder reflects a plurality of characteristically delayed response signals instead of a response signal with different frequency components.

For digital processing and decoding, the low-frequency signals are supplied to a unit with A/D converter and DSP 8. The code is buffered, for example, in a memory 9. In the transponder 2 the interrogation signal received via the antenna 10 is supplied to a combination according to the present invention of encoding unit 11, calibrating unit 12 and measuring unit 13. Combination means in this connection that one unit can even be missing. In the following, the function of the different units is explained on the basis of examples. The complete transponder is realized such that a time interval $T_0$ passes before the first signal component $R_A$ is received, said time interval $T_0$ having preferably half the length of the time interval $T_1$ (longest propagation of a response signal component). In this way, the useful signal can effectively be freed from environmental disturbances caused by reflection (external reflection).

Figure 2A:
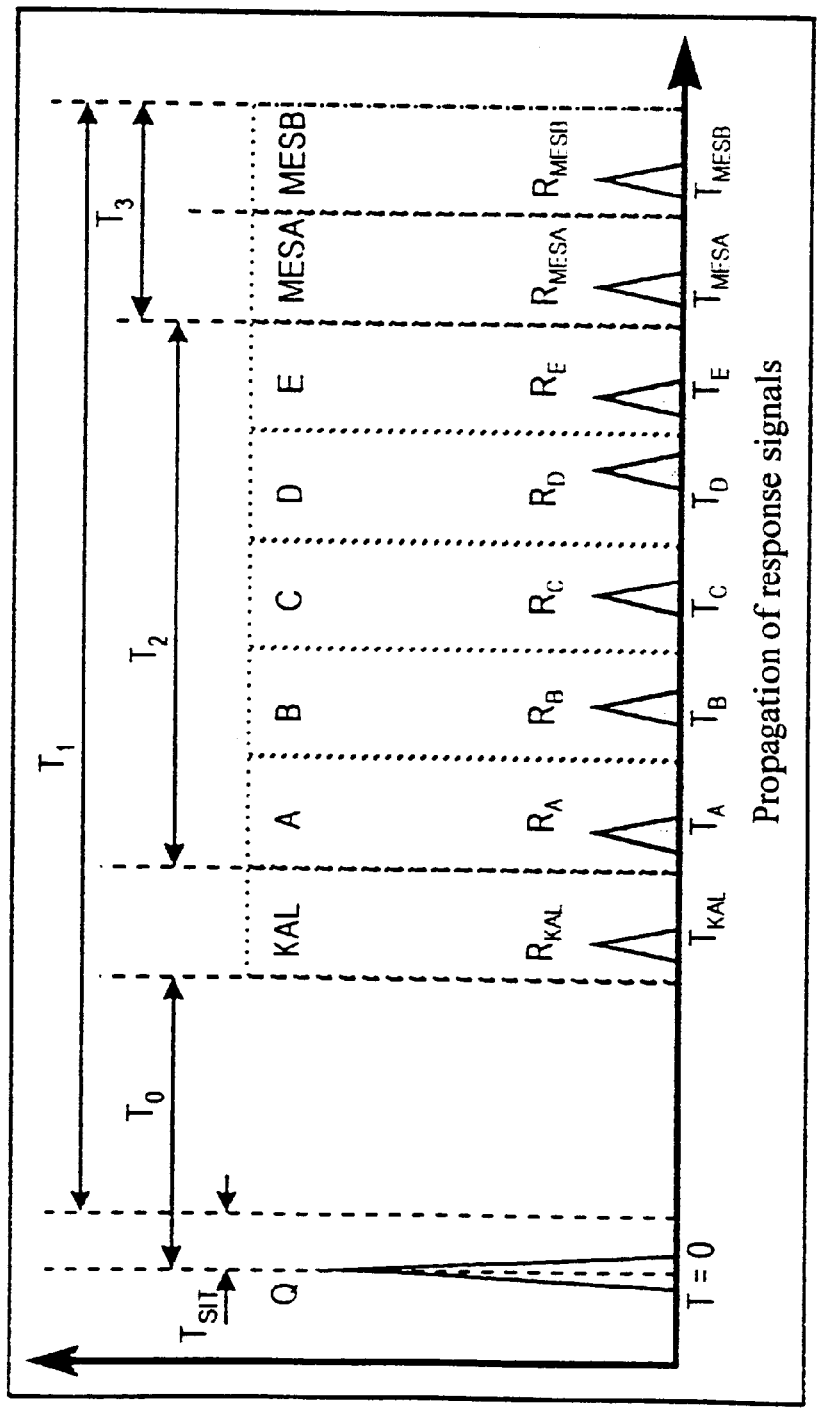
FIG. 2a, b time diagrams for the explanation of the position encoding in combination with calibration and measurement.

The function of the encoding unit 11 and the signal encoding according to the present invention will be explained exemplarily on the basis of FIGS. 2a, b. FIG. 2a schematically shows a possible signal constellation (the time t is indicated on the abszissa). At the time t=0, for example an interrogation signal Q is emitted in pulses with a carrier frequency of e.g. 2.44 GHz. The pulse duration is e.g. 25 ns. A transponder being within the range receives the interrogation signal Q and converts it in its encoding unit 11 containing one or a plurality of SAW elements into a plurality of response signals having, for example, five identifying signal components RA, . . . , RE.

The time interval $T_2=T_1-T_0$, whose length is preset for the system (which, as a rule, comprises a plurality of transponders), is divided into a plurality of e.g. five identifying time windows A,B, . . . . The length of the time windows $\Delta T_{ZF}$ is the same, for example, for all identifying time windows, e.g. 125 ns.

All transponders of one application are realized such that in any one of the five identifying time windows exactly one identifying signal component is located. According to the invention, the position, i.e. the exact propagation, of an identifying signal component within the corresponding time window is determined by the encoding realized in the transponder (position encoding) except for disturbing propagation changes.

Figure 2B:
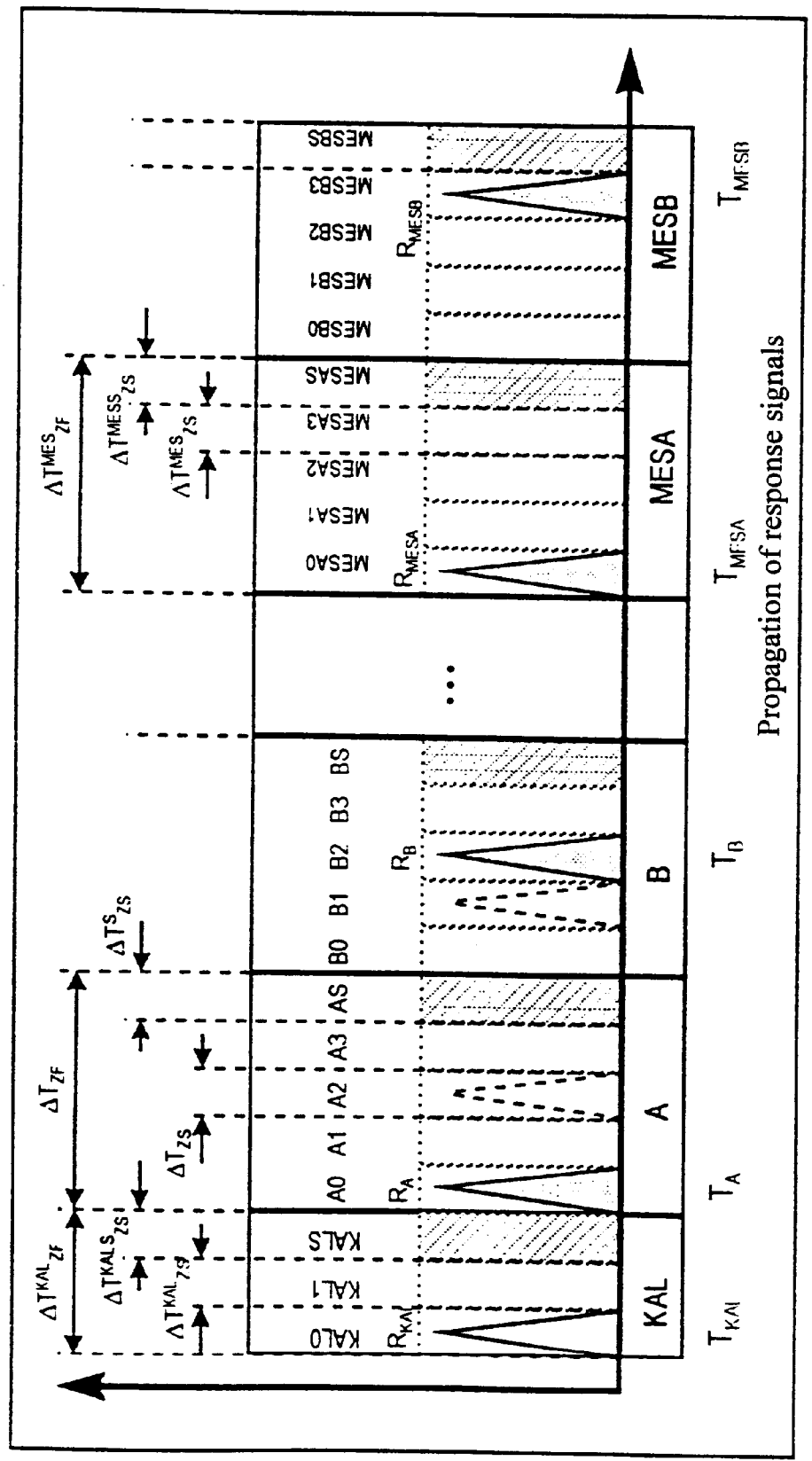

FIG. 2b shows the decoding of the response signal. All identifying time windows A,B, ... having the length $\Delta T_{ZF}$ are divided into a predetermined number of, for example, five time slots A0,A1, ... ,B0,B1, ... each. The minimum length of the time slots $\Delta T_{ZS}$ depends on the bandwidth of the interrogation system and the resolution of two short signal pulses which can be derived therefrom and can still be achieved. In a preferred embodiment with a chirp signal of 40 MHz, there is thus a minimum length of 25 ns.

According to the invention, the identifying time windows A,B, ... contain an additional off-time slot AS,BS, ... having the length $\Delta T^S_{ZS}$. Encoding takes place such that no identifying response signal is located in the off-time slot. Thus, the minimum possible time distance between two identifying signal components in neighboring time windows can be set as requested (cf. also FIG. 2b). In the present example, the length of the off-time slot is the same as that of the identifying time slots in the corresponding time windows. The achievable signal-to-noise ratio is thus increased in the decoder 8.

In a preferred embodiment the identifying time windows A,B, ... ,E thus contain four identifying time slots A0, ... ,A3 or B0, ... ,B3, etc. and an off-time slot AS or BS, etc., and all time slots in one window have the same length, e.g. 25 ns. The result is a time window length of 5×25 ns=125 ns.

For the identification of the transponder, the interrogation station must determine the time positions TA, ... ,TE of the identifying response signals and must allocate them to the predetermined time slots (in this case e.g. A0, B2, ... ) for decoding. The pattern of the thus occupied time slots of all identifying time windows determines the transponder-specific code.

The broken lines in FIG. 2b indicate other possible positions of signal components (time slots A2, B1, ... ) that can be present in a second transponder having a different code.

According to equation (1), $4^5$=1024 codes can be realized with five time windows with four identifying time slots each. If it is necessary in practice, the number of windows or time slots may be increased (with ten windows with four slots each, there are already $4^{10}=2^{20}$, i.e. 20 bits).

It is not necessary that the response signal components ($R_A$, ... ,$R_E$) lie completely in one time slot. It is also possible that they stand out on both sides of one time slot. At least the "center of energy mass", however, must be localized sufficiently exactly. However, overlapping reduces the signal-to-noise ratio and thus the reading distance.

Figure 3:
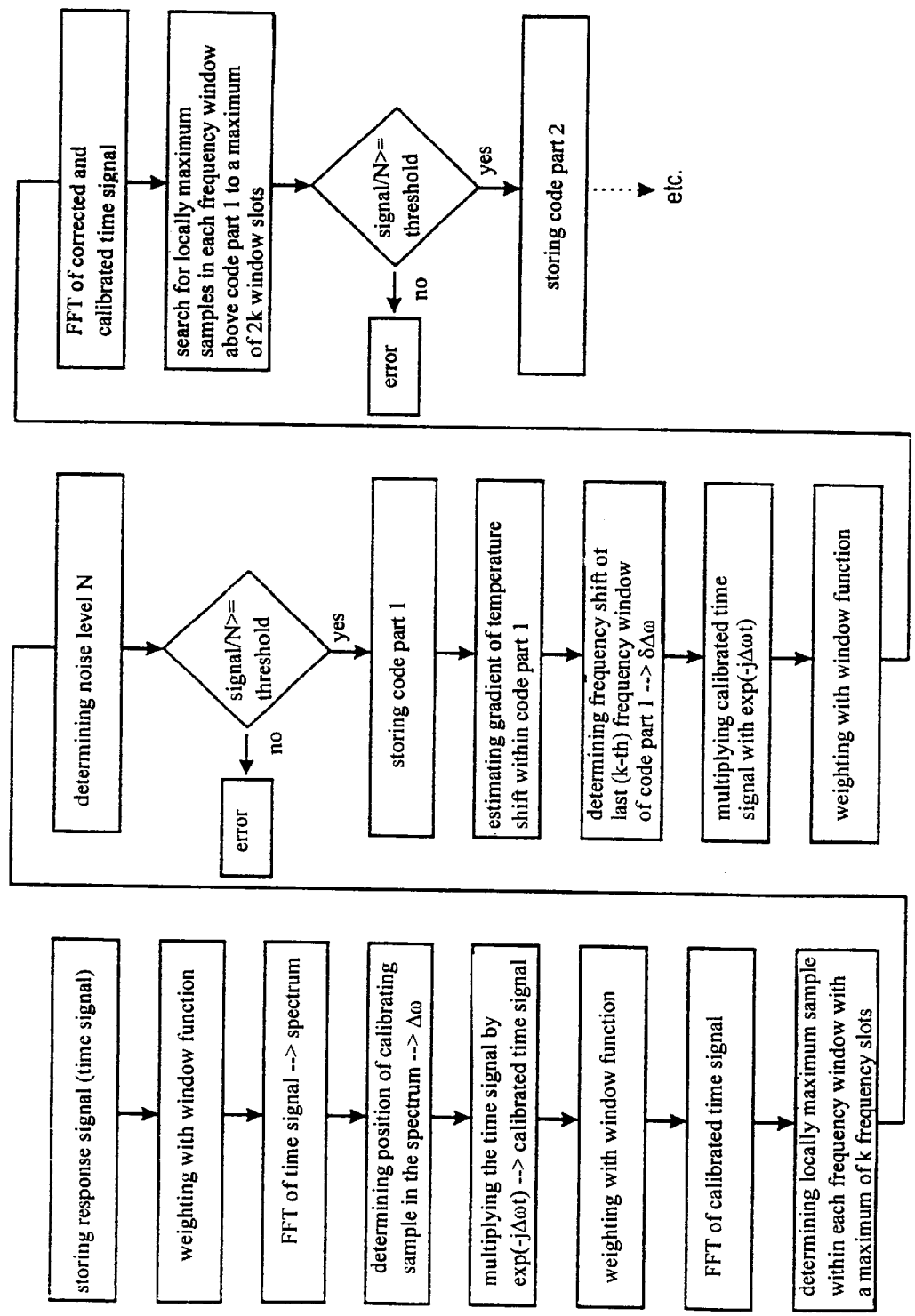
FIG. 3 a flow diagram of the signal processing for evaluating the information in the response signal.

A process for decoding the information contained in the identifying response signal, which process can, according to the invention, be used for an interrogation system with chirp signals, is described in the following. The individual process steps are indicated in FIG. 3.

The transformation for processing in the frequency domain (spectrum of the response signal) is advantageously realized by a discrete Fourier transformation (FFT) making use of a digital signal processor (DSP). According to the invention, the scanning frequency for the discretization is selected such that the possible response signals exactly meet a sample of the discrete Fourier transformation. As a result, according to a preferred embodiment, there is a sample distance of 62.5 Hz (=25 ns×2.5 Hz/ns). This resolution in the frequency domain exactly corresponds to the resolution achievable by the transmission period of $T_{BEOB}$=16 ms, i.e. $1/T_{BEOB}$. The number of samples depends on the total number of time slots in the transponder. From this in turn the scanning frequency can be determined which corresponds to at least twice the frequency of the highest sample in the relevant spectrum (taking into consideration the basic delay $T_0$). With eight time windows ($N_{ZF}$) with five time slots ($N_{ZS}$) each and a basic delay $T^0$=1000 ns, there is a scanning frequency of at least 2*(5*8*25 ns+1000 ns)*2.5 Hz/ns=10 kHz. In principle, the entire information contained in the response signals is now contained in the spectrum which is divided into frequency windows and frequency slots completely analog to the time domain. Decoding is carried out by testing which frequency slot in the corresponding frequency window is occupied by a response signal.

In order to make things more clear, for the following statements it is again changed to a description in the time domain.

If a transponder contains an encoding unit without calibrating unit, considerable problems result during practical application. In particular, the field of application of the system is limited considerably. The measurement of the propagations $T_A,T_B$, ... ,$T_E$, which is necessary for identification, must be carried out so exactly that a clear allocation to a time slot is possible. This is certainly possible if the precision of the propagation measurement corresponds to at least half the length of the identifying time slots, e.g. 12.5 ns.

Propagation of the identifying response signals is changed generally (to the same extent for all) by:
1. changes in the air gap length (reading distance);
2. changes in the length of the antenna supply line;
3. changes in the propagation of the interrogation station, for example by aging or temperature changes of electronic components,
4. temperature-dependent changes in the delay $T_0$-$T_{SIT}$ ($T_{SIT}$ is the mostly variable part of the basic delay $T_0$ lying outside the transponder) which is the same for all response signals in the transponder, to mention only some important general disturbing influences. For example, additional 2 meters of antenna cable and 3 meters air gap already lead to a propagation increase of 40 ns if it is taken into consideration that the signal passes to the transponder and back again.

The propagation of the response signal is additionally changed individually (to a different extent for each response signal) by:
1. temperature-dependent propagation variations in the individual acoustic channels of the encoding unit,
2. changes of the signal speed in the individual acoustic channels of the encoding unit, to mention some important individual disturbing influences.

A calibrating response signal $R_{KAL}$ is used which measures the general disturbing influences on the propagations of the response signals. For this, according to the invention, exactly one response signal is generated whose position in a time slot of the calibrating time window is exactly known in advance to the interrogation system. $T_{KAL}$ is the propagation of the calibrating response signal.

A process for reduction of the general disturbing influences is described in the following, which process can, in accordance with the invention, be used for the above interrogation system with chirp signals. For this, in turn, it is changed to a description in the frequency domain.

As a result of the mentioned disturbing influences, in particular the general ones, the spectrum of the response signal is no longer, as desired, on the discrete sample grid of the FFT. Starting from a certain degree, the shifts can even lead to a wrong reading of the code. As mentioned above, according to the invention a calibrating response signal is therefore generated whose transponder-generated delay is known to the interrogation station and equal for all transponders of one application.

This calibrating time window can preferably be arranged on the transponder as the first time window KAL (cf. FIGS. 2a, b). In other embodiments the calibrating time window can also preferably be located between the identifying time windows or even at the end.

With a suitable weighting of the sample values before transformation (so-called FFT windows), a good decorrelation of the individual identifying responses in the spectrum can be achieved if there is a certain distance between the calibrating time slot (KAL0, $\Delta T^{KAL}_{ZS}$) and the subsequent identifying time slots. This distance is realized by the calibrating off-time slot (KALS, $\Delta T^{KAL}_{ZS}$). The exact position of the maximum of the calibrating response signal can be determined in the spectrum. For this, only the closest environment of the expected position must be checked in order to exclude possible disturbing signals such as e.g. triple reflexes. This can be done by the known matched filter technique or by correlation since the desired position of the calibrating response signal is known to the interrogation means. Consequently, with respect to the theoretical, transponder-independent, expected frequency of the calibrating signal, there is an exact value for the frequency error $\Delta\omega$ being independent of the sample grid.

By subsequently multiplying (mixing) the sampled response signal in the time domain, wherein the time signal preferably remains stored in the signal processor, with the complex function $$f(t) = e^{-j\Delta\omega t} \quad (2)$$

a spectral shift of the time signal by the frequency error $\Delta\omega$ is achieved. The now calibrated, complex time signal now undergoes the same FFT which was used for determining the frequency error. Now the spectra of all response signals lie almost exactly on the desired samples of the FFT, and a decoding error due to non-determined general propagation shifts can thus be excluded.

The interrogation means can subsequently interrogate the spectral samples of each identifying time slot or frequency slot for its amplitude. Since due to the used kind of position encoding one frequency slot per frequency window must be occupied, the maximum sample within an identifying frequency window corresponds to the desired position of the identifying response signal.

To avoid decoding errors if there are weak receiving signals, outside the frequency range occupied by the response signal, preferably in the range corresponding to the basic delay $T_0$, the noise level of the entire signal received by the interrogation station is then determined. If the ratio between the detected maximum in the identifying frequency slots and the noise level is too low, the encoded information is rejected.

The spectrum for evaluating the response signal calibrated in accordance with the invention also corrects in particular the temperature-dependent shift of the basic delay $T_0$. The individual part of the propagation shift of the response signals, however, is not corrected. This can be explained on the basis of the situation exemplarily shown in FIGS. 2a, b. In this embodiment, the calibrating time window (KAL) having the length $\Delta T^{KAL}_{ZF}$ lies in front of the identifying time windows. The shifts of the basic delay $T_0$ can be corrected in this arrangement. However, for the subsequent identifying response signals (A,B, ...) the temperature is still effective. At a temperature change of 100° and a temperature coefficient of about 70 ppm/° C. for lithium niobate there is a relative propagation delay of 0.7%. This shift starts to having a negative effect on decoding if the shift of all identifying time windows (A,B, ...) in the time interval T2 reaches half of the time slot duration $\Delta T_{ZS}$, e.g. 25 ns/2=12.5 ns. It is an advantageous feature of the position encoding according to the present invention that this individual disturbing influence does not start to have a negative effect before in the preferred embodiment the number of all identifying time slots is larger than e.g. about 70. In the preferred embodiment comprising five time slots each, for a temperature range of 100° C. a maximum of about 70/5=14 identifying time windows (A,B, ...) or about 70×4/5=56 identifying time slots can be used without further correcting the calibration.

For transponders having more identifying time slots or for a higher temperature range, either the length of the time slots can be increased, or a second calibrating time slot can be introduced, or a further frequency correction $\delta\Delta\omega$ can be determined by means of a gradient algorithm (calibration correction). For this, the further frequency correction $\delta\Delta\omega$ is determined from the theoretically linarly increasing shift of the spectral centers of the calibrated and correctly decoded response signals (until and including e.g. time slot K) by correlation with the desired response signal. According to the invention, the value $\delta\Delta\omega$ corresponds to the frequency error determined from the gradient, said frequency error corresponding to the temperature-dependent individual propagation delay for the identifying time slot K being the last one which was evaluated so far.

In the same way as described above, for the next amount of time slots (I,J, ...) of the stored response signals the spectrum of the time signal is again spectrally shifted by the value $\delta\Delta\omega$ by means of said complex multiplication (equation (2)) in the time domain and again Fourier transformed. For said next amount of time slots (I,J, ...) the temperature-dependent shift is also not disturbing. The corresponding identifying response signals can now also be decoded.

For further securing the encoding, the temperature-dependent gradient in the delay of subsequent time slots can be determined in said second amount of time slots and compared with the frequency correction value $\Delta\omega$ of the first amount. In a further embodiment the signal quality can be improved by filtering subsequent detection processes (a plurality of chirps each lasting $T_{BEOB}$=16 ms).

In sum, there are, for example, the following process steps (cf. FIG. 3):

a) storing the response signal as a time signal in the interrogation station;
b) weighting with a suitable window function;
c) determining the spectrum of the weighted time signal (discrete Fourier transformation);
d) determining the position of the calibrating sample in the spectrum (determining $\Delta\omega$);
e) generating a calibrated time signal by multiplying the stored time signal by exp($-j\Delta\omega t$);
f) weighting with a suitable window function;
g) calculating the discrete Fourier transformation of the calibrated time signal;
h) determining the locally maximum sample within each frequency window with a maximum of k frequency slots;
i) determining the noise level;
j) interrupting the further evaluation if the signal-to-noise ratio lies below a predetermined threshold;
k) storing code part 1;

l) estimating the gradient of the temperature-dependent shift within the selected code part 1;

m) determining the frequency shift of the last (i.e. k-th) frequency window of code part 1, i.e. the value $\delta\Delta\omega$;

n) correcting the calibrated time signals by multiplication with $\exp(-j\Delta\omega t)$;

o) weighting with a suitable window function;

p) determining the discrete Fourier transformation of the corrected calibrated time signal;

q) search for the locally maximum sample in each frequency window to the remaining (higher) code parts (up to a maximum of 2 $k$ window slots);

r) again checking the S/N ratio;

s) storing the second code part;

t) analog processing of the entire code.

In the following a process for determining the information contained in the measuring response signals is described, which process can, according to the invention, be used for an interrogation system with chirp signals and transponders which comprise at least one identifying unit.

According to the invention, in said transponder at least two acoustic channels each having one time window (MESA, MESB) having the length $T_{MESA}$, $T_{MESB}$ are used for measuring purposes, in particular for measuring the temperature of the transponder. (In FIG. 2a $T_3$ is the propagation of the measuring response signals). It is advantageous in this connection if these two channels overlap so that the measuring response signals ($R_{MESA}$, $R_{MESB}$) have a long, common signal line. For example, the process described in the patents of X-Cyte, i.e. the process of measuring the phase of the two measuring signals, can be used for measuring the temperature. The temperature change can be determined on the basis of the change in the difference of the two phases. In principle it is known and described in the patents of X-Cyte how this phase measurement is carried out.

In a preferred embodiment the measuring time windows (MESA, MESB) $\Delta T^{MES}_{ZF}$ contain only one time slot and one off-time slot and are arranged after the identifying time slots. The length of the corresponding time slots (MESA0, ... MESB0, ...) $\Delta T^{MES}_{ZF}$ is selected such that there is no angle ambiguity (more than 360°) and a sufficiently good sensitivity is achieved. In a preferred embodiment the length of the measuring time slots (MESA0, MESB0) and the length of the corresponding off-time slot (MESAS, MESBS) $\Delta T^{MESS}_{ZS}$ is e.g. 25 ns. With lithium niobate there is thus, for example for a temperature change of 100°, a relative phase change of about 306°/100° C. or about 3°/° C.

With the above arrangement only the relative temperature can be measured. The absolute temperature can be calculated since with the combination of encoding unit and measuring unit according to the invention it is possible to store calibrating information belonging to the corresponding transponder code in the interrogation station.

Figure 4:
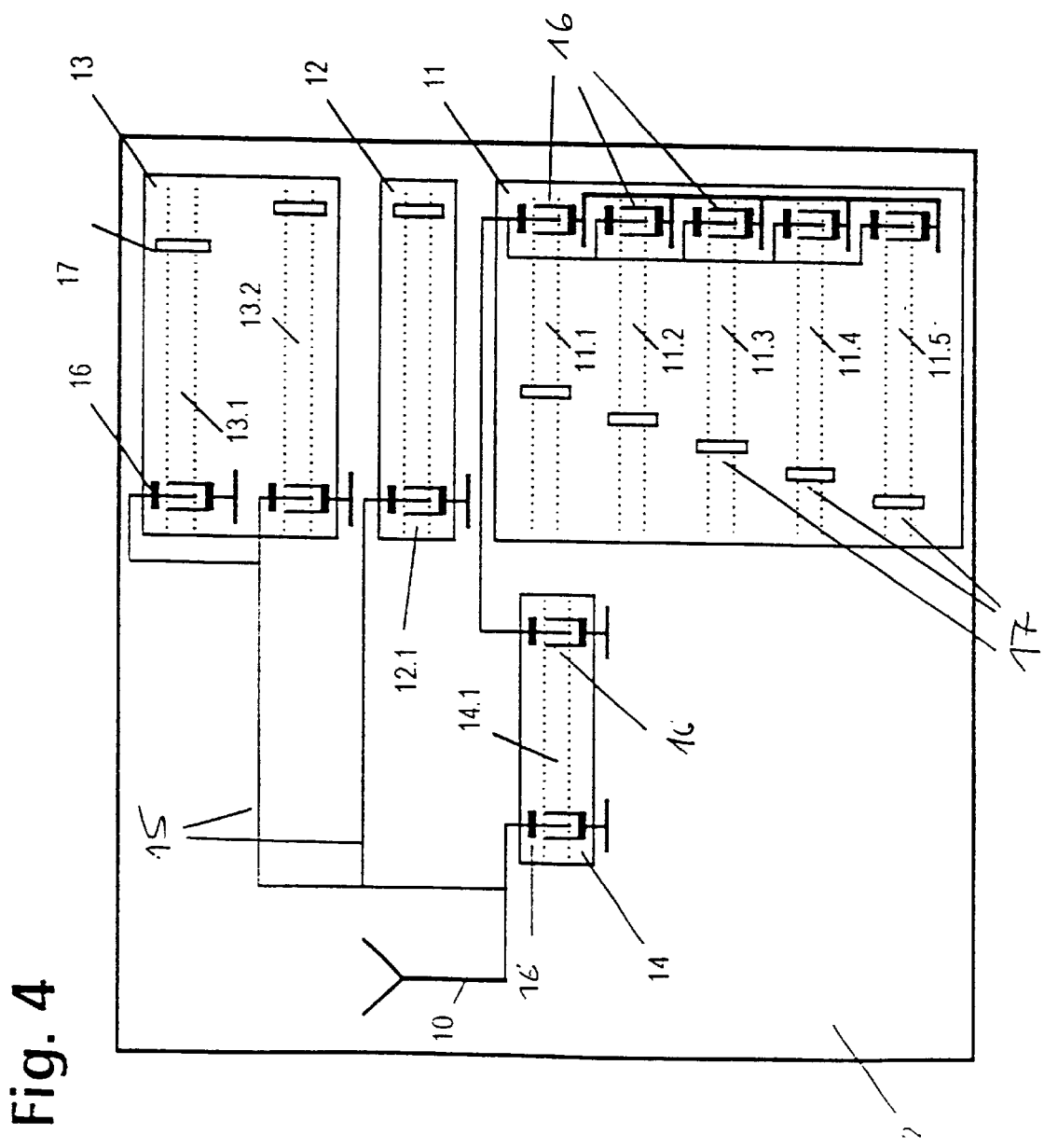
FIG. 4 a schematic representation of a transponder with a measuring, calibrating and encoding unit as well as a common delay line and transducers emitting on one side.

In a preferred embodiment, the encoding unit 11 and the calibrating unit 12.1 are realized as a SAW element (cf. FIG. 4). In the present example the encoding unit 11 comprises five encoding channels 11.1 to 11.5 which generate one identifying response signal component each. The encoding channels are physically realized as five acoustic channels. In any one of the acoustic channels one transducer electrode 16 and one reflector 17 are realized. The reflectors are arranged such that the five mentioned encoding channels 11.1, ... 11.5 have a code-specific length.

The delay line 14 being also implemented on a SAW element is located between the antenna 10 and the encoding unit 11. It makes sure that the response signal has the mentioned basic delay $T_0$. According to the invention, the basic delay $T_0$ is not generated in the individual encoding channels 11.1 to 11.5 but in a separate channel being connected upstream or downstream. If the basic delay is carried out in each individual encoding channel (i.e. together with the encoding), a much larger substrate surface is required than in the embodiment according to the present invention. For this it is not urgently necessary that the entire delay $T_0$ (initial dealy) is realized in the separated signal line 14.

The interrogation signal received by the antenna 10 is coupled into the acoustic channel 14.1 of a SAW element via a first transducer electrode 16; there it is delayed by a time $t_{delay}/2$ ($<=T_0/2$), coupled out via a second transducer electrode 16 and supplied to the encoding unit 11 via an electrical line. In the latter the interrogation signal is reflected and delayed in accordance with the corresponding length of the encoding channels and delayed for a second time in the signal line 14 by $t_{delay}/2$. The entire signal delay by the signal line 12 is thus 2 $t_{delay}/2 = t_{delay}$. In order to generate e.g. $t_{delay} = 1\ \mu s$, on a 128-LiNbO$_3$ substrate a length of L=1990 $\mu m$ is needed, i.e. about 2 mm. Preferably, $t_{delay}$ is about as long as or slightly longer (e.g. 10%) than $T_2$.

FIG. 4 shows an optional extension of the SAW unit 11, i.e. further calibrating units 12 and measuring units 13 having acoustic channels are provided in addition to the encoding unit 11. These further units are, for example, directly connected with the antenna 10, however, they can also be led via the delay line 14. In an acoustic channel which is realized in accordance with the encoding channels and is the same for all transponders of at least one application, the calibrating unit generates said calibrating response signal ($R_{KAL}$). By placing the reflector at different positions in the calibrating channel, a group-specific encoding can be generated with otherwise the same encoding by using the position of the calibrating response signal as a group code. The measuring unit comprises, for example, two channels 13.1, 13.2 for generating measuring response signal components (which can, in particular, be used for temperature measurement).

An individual propagation-increasing signal line can be introduced into units 12 and 13. That means that, if it is desired, a transponder can also have a plurality of common delay lines having a different length.

Figure 5:
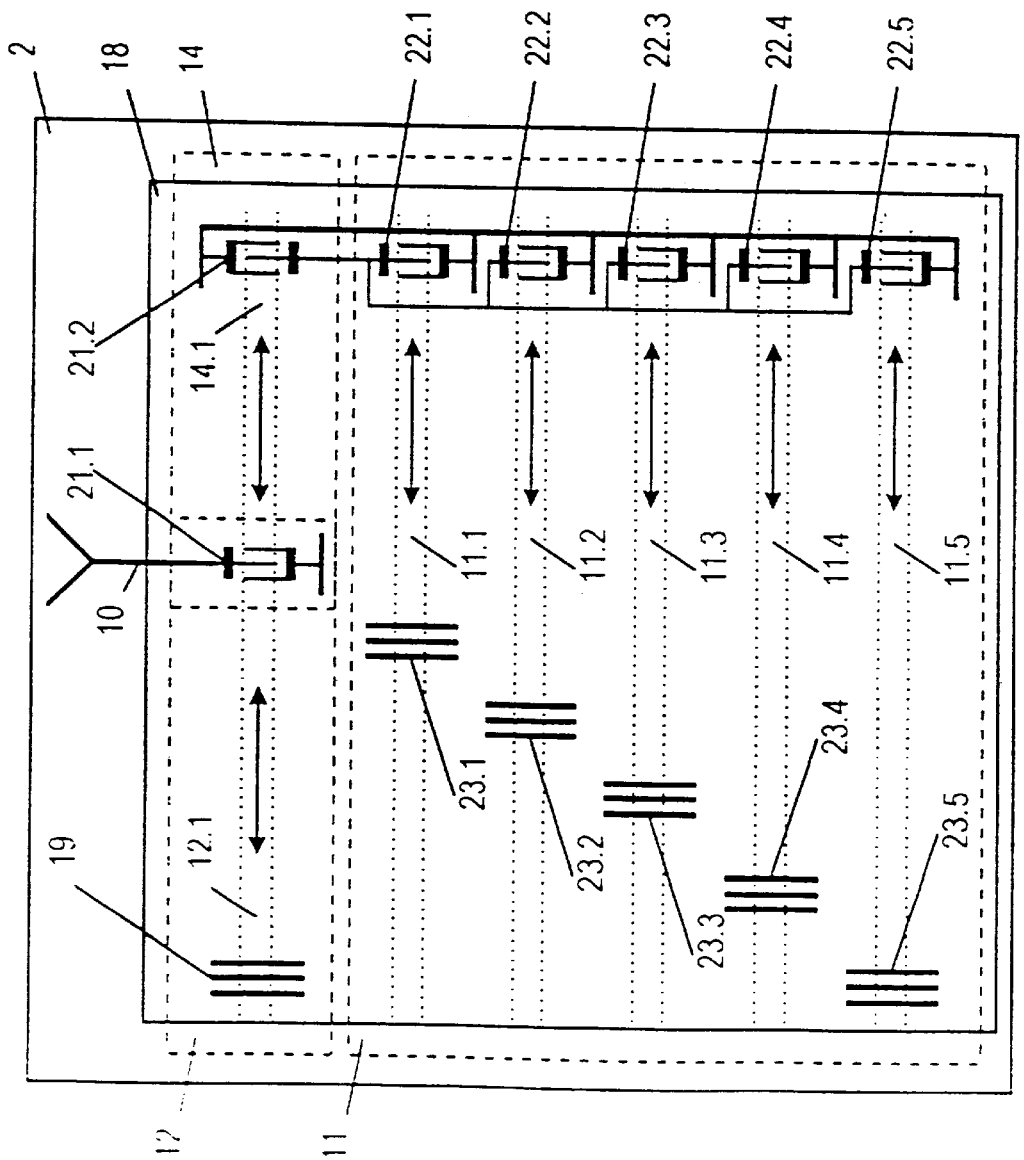
FIG. 5 a schematic representation of a calibrating and encoding unit realized with a SAW element with partially common delay line, transducer coupling and transducers emitting on one side in the encoding channels.

FIG. 5 shows a preferred embodiment of the invention, wherein in an arrangement corresponding to FIG. 2 an encoding unit and a calibrating unit are realized on only one SAW chip 18. In addition to the five encoding channels 11.1 to 11.5 mentioned in this example, there are additionally provided a channel 14.1 as a propagation-increasing signal line and a calibrating channel. In this embodiment said delay line will preferably be somewhat smaller than $T_0/2$ so that the triple reflex from this channel 14.1 lies before the calibrating response signal from channel 12.1.

In this embodiment the transducer 21.1 emits in both directions, i.e. on the one hand to an 180° reflector 19 and, on the other hand, to a transducer 21.2. Five transducers 22.1, ... , 22.5 emitting in one direction are connected in parallel with the transducer 22.2. They emit surface waves in the direction of the code-specifically positioned reflectors 23.1, ... , 23.5.

The advantage of the geometrical arrangement according to the preferred embodiment lies in that the electrical connecting lines (busbars) between the transducer electrodes 21.2, 22.1 to 22.5 lying in one line at the edge of the chip are relatively short and thus resistance losses can be minimized. The connecting lines shown in FIG. 5 should have a small resistance in the sense of the following criterion:

$$2\pi f * R * C \ll 1, \quad (3)$$

R is the parasitic line resistance, C is the entire static capacity of the IDT electrode structure (IDT=interdigital transducer) and f is the operating frequency (e.g. f=2.45 GHz).

According to the invention, in a further embodiment of the combination of encoding unit 11, calibrating unit 12 and delay line 14 the disturbing internal reflections on the transducers 21.2, 22.1 to 22.5 are considerably reduced visa-vis the useful signal components (e.g. more than −20 dB) by the measures described below (in particular 90° reflectors and RMSC structures).

FIG. 6a shows a variant of FIG. 5 in which the coupling, which is shown in an embodiment comprising three encoding channels, between the acoustic channels 14.1, 11.1 to 11.3 (FIG. 6a) is not carried out by means of transducer electrodes 22.2 and 22.1 to 22.5 (FIG. 5) but by means of correspondingly arranged 90° reflectors 25, 26.1 to 26.3. The channel 14.1, which is arranged on the top in the embodiment according to FIG. 6a, comprises a 90° reflector 25 which reflects the surface waves out of the channel in an angle of 90° (in the embodiment according to FIG. 6a to the "bottom"). The 90° reflectors 26.1 to 26.3 are aligned such with respect to the 90° reflector 25 that part of the surface wave coupled out in the 90° angle is coupled into the corresponding channel 11.1 to 11.3. There it passes to the reflectors 23.1 to 23.3 (180° reflectors), is reflected and passed back into the channel 14.1 via the 90° reflectors.

The angle between the inclined finger electrodes of the 90° reflectors and the crystallographic x-coordinate is close to 45° and depends on the anisotropy of the substrate used. (With respect to the dimension of such 90° reflectors— which is known in a different connection—it is referred to the book "Surface-wave devices for signal processing", D. Morgan, Elsevier, 1985).

It is a matter of fact that at least the 90° reflectors 26.1, 26.2 must be semi-transparent.

A variant would result if the encoding channel 11.1 and the calibrating channel 12.1 (FIG. 6a) were caused to partially overlap by inserting a second semi-transparent reflector 27 into the encoding channel 11.1. In this arrangement the reflector 27 generates a calibrating response signal and, at the same time, allows passage of part of the incident surface waves.

The embodiment according to FIG. 6a has the following advantages:

1. In case of inclined reflectors, the width of the electrode fingers is enlarged, e.g. with 90° reflectors by the factor √2 larger than the corresponding width with 180° reflectors (vertical wave incidence). This is an important advantage for the 2.45 GHz frequency range.
2. The resistance losses in the electrodes are lower since there is no electric current flow from one electrode to the other (all currents are local).
3. There are almost no disturbing internal reflections; thereby in particular the disturbing triple reflections (between the reflectors and transducers in FIG. 5) are omitted.
4. The wave propagation transversely with respect to the x-coordinate of the crystal introduces additional signal delays which are preferred in the invention. The chip surface can be optimized or minimized accordingly.

In sum, what makes this embodiment stand out is thus a great dimensioning flexibility, a manufacturability which is nowadays simplified (higher yield) and considerably reduced internal disturbing reflexes.

Figure 6B:
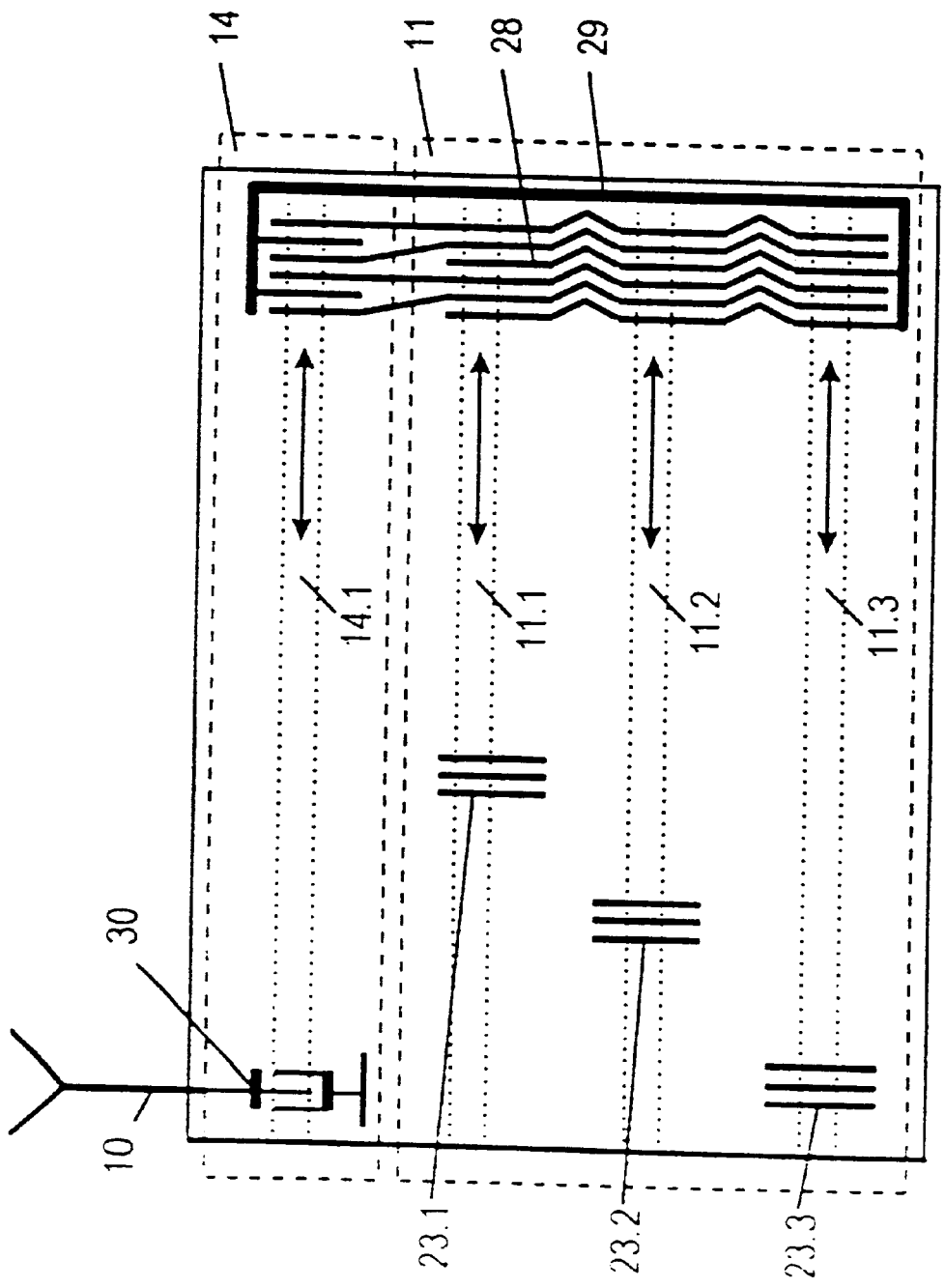
FIG. 6b a schematic representation of an encoding unit realized on a SAW element with common delay line, coupling via RMSC structures and transducers emitting on one side in the encoding channels.
Figure 6C:
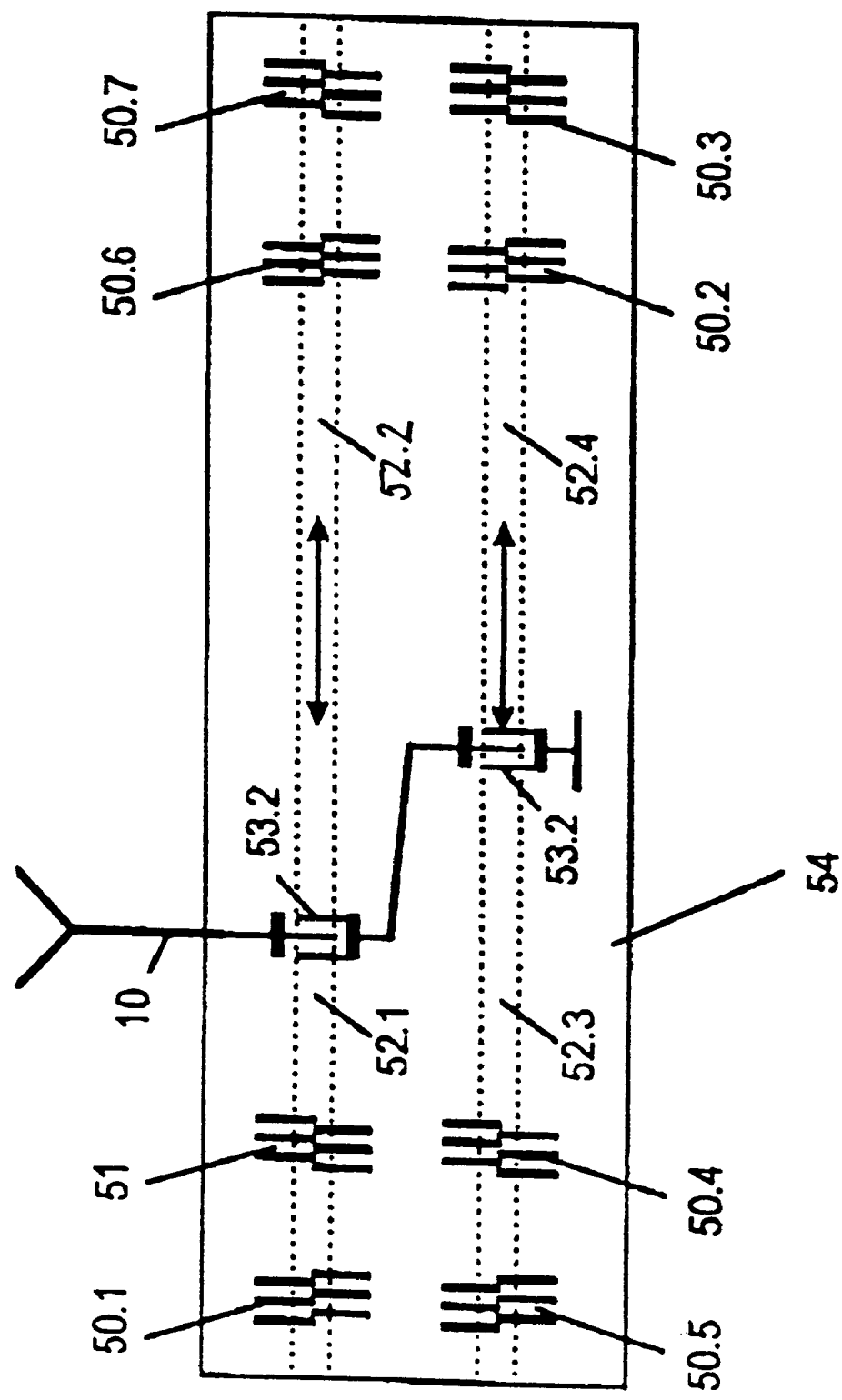
FIG. 6c a schematic representation of a calibrating and encoding unit with offset reflectors realized on an SAW element.

FIG. 6b shows a further possibility of coupling the propagation-delayed channel 14.1 with encoding or calibrating channels, for example three encoding channels 11.1 to 11.3. Coupling is realized by a RMSC structure 28 (reversing multistrip coupler) as exemplarily shown in FIG. 6b.

This structure is an electrode structure which is known from other applications and which is surrounded in the present embodiment by a ring-shaped (or C-shaped) electrode 29 (ring ground electrode) in order to be able to avoid technically involved and thus expensive electrode crossings. Further explanations of the known RMSC structure are superfluous (cf., e.g., E. Danicki, "A SAW resonator filter explaiting RMSCs", 1994, Frequency Control Symp. Proc.).

The RMSC structure can operate on the basic frequency and the second harmonic. At an operation in the basic frequency the width of the electrodes is λ/6 (e.g. λ/6=0.26 μm at a basis frequency of 2.45 GHz). At an operation in the second harmonic the electrode width advantageously doubles (e.g. 0.52 μm).

RMSC structures have numerous advantages for realizing, for example, encoding channel and calibrating channel having a common delay line 14 on one SAW chip in accordance with the invention:

1. The known electromechanical coupling of the surface waves leads to the fact that a disturbing back reflection in the same channel is very weak. In particular, the disturbing reflections on the transducer 21.2 and multiple reflections in the encoding channels 11.1 to 11.5 (FIG. 5) can be reduced to a very large extent.
2. Furthermore, wave transmission and reflection of one channel into the other is almost complete if the number of electrode fingers is sufficiently large, i.e. has a dimension of $3*(\Delta V/V)^{-1}$, wherein ΔV/V is the known coupling factor for describing the strength of the piezo effect in surface acoustic waves.

The embodiment according to FIG. 6b thus uses a RMSC structure. The electrode 29 surrounds all four channels 14.1, 11.1 to 11.3. The wave incident into the RMSC structure in the uppermost channel 14.1 is, for example, coupled into the three channels 11.1 to 11.3 and emitted to have a reversed propagation direction. Correspondingly, from the channels 11.1 to 11.3 the code-specific reflections are returned into the channel 14.1 and emitted there in the opposite direction. According to a particularly preferred embodiment, the electrode fingers are deformed to have a V-shape between the encoding channels 11.1 to 11.3. It is thus avoided that the surface waves are emitted between the encoding channels 11.1 to 11.3. Instead of the V-shaped deformations also other deformations can certainly be realized (for preventing undesired SAW radiation).

It would also be possible to replace the reflectors 23.1 to 23.3 with output transducers both in FIG. 5 and FIGS. 6a and 6b so that in the individual encoding channels 11.1 to 11.3 incident interrogation signals are not reflected and passed to the antenna 10 via the transducer 21.1, 24, or 30 but that the response signals generated in the encoding channels 11.1 to 11.3 are passed directly to the antenna 10 via said output transducers.

128-LiNbO$_3$ is preferably used as the substrate for the SAW element. What makes this material stand out is the strong piezoelectric coupling which is important for preventing the losses of relatively wide-banded transducers. Furthermore, this material has a high surface wave velocity and a low level of parasitic bulk waves. However, other substrates can also be used. For the embodiment comprising the 90° reflector, for example, YZ-LiNbO$_3$ is advantageous due to the low diffraction losses.

The transducers in all embodiments can be realized as so-called split electrode transducers operating on the third harmonic. In this case, the width of the electrode for 128-LiNbO$_3$ is about 0.6 µm (like the distances between the electrode fingers). For so-called self matched transducers (i.e. transducers for which the imaginary part of admittance is close to zero) a structure with about 25 split electrodes (50 electrode fingers) is necessary. The real part of admittance is close to 50 Ohms if the aperture is close to 100 λ (λ=wavelength of the surface wave, e.g. 1.6 µm at 2.45 GHz). The duration of the pulse response of such a transducer is about 15 ns.

The reflectors can operate either at the basic frequency or at the third harmonic. In the first case about 40 to 50 electrode fingers are necessary for a strong total reflection. This means a time delay within the reflectors of about 16 ns. Since the production technological demands on electrodes having a width of 0.4 µm are high, often split electrodes are use which operate on the third harmonic and which have a width of about 0.6 µm for LiNbO$_3$ at 2.45 GHz. The number of split electrodes lies typically in the range of 15 to 25.

Reflector structures which, according to the invention, are suitable for the use in transponders (cf. FIGS. 6d and 3) are periodical (period=pitch) and consist of electrode fingers 31, gaps 32, and electrical connections between the fingers and operate on the second harmonic. The width w of the fingers is preferably about half the period, w=2*λ/4, wherein λ is the wavelength at the operating frequency ν, wherein ν=2.45 GHz.

In a preferred embodiment the second harmonic reflectors are realized on a 128°-LiNbO$_3$ substrate material with a metal layer thickness of about 800 Å.

Figure 6E:
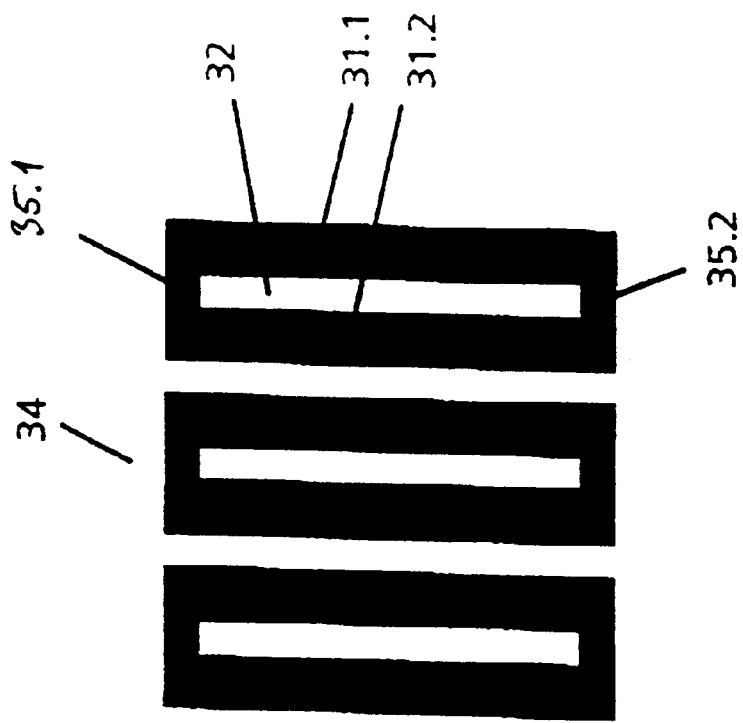
FIG. 6e an embodiment of a second harmonic reflector according to the invention.
Figure 6D:
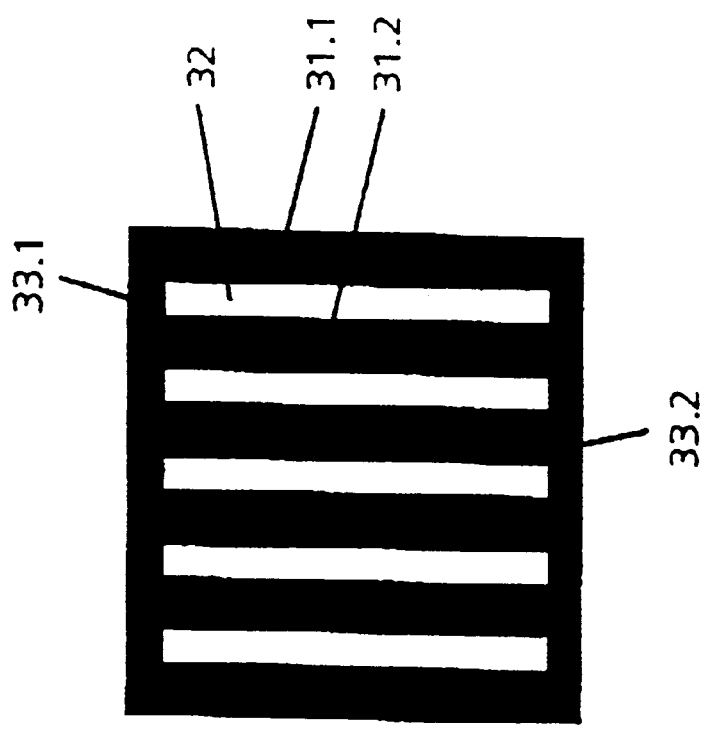
FIG. 6d a preferred embodiment of a second harmonic reflector.

FIG. 6d describes a preferred embodiment of a second harmonic reflector having six electrode fingers and five gaps 32. The number of electrode fingers is variable and can be at least 1 and at most about 50. The width of the electrode fingers, e.g. 31.1, is preferably the same as the width of the gaps 32. The width w of the electrode fingers on 128°-LiNbO$_3$ is about w=2*λ/4=0.78 µm, wherein λ is the wavelength of the SAW signal at an operating frequency of 2.45 GHz. Via a connection at the upper end 33.1 and lower end 33.2 of the finger, all electrode fingers are electrically connected with each other. The width of the connection is preferably about 10 µm; however, a smaller or larger width can also be selected. The preferred width of the reflector or the length of the electrode finger is between about 150 to 200 µm; however, other values are also possible.

The reflectivity R (in dB) of said reflector at a center frequency can be calculated by R (in dB)=20*log(tanhyp (N*r)), wherein n is the number of electrode fingers and r is the reflection coefficient of the individual finger. As compared to third harmonic reflectors on a 128°-LiNbO$_3$ substrate material whose metal layer has a thickness of 800 Å and N=12 fingers, with second harmonic reflectors a reflectivity can be achieved which is 6 dB higher.

FIG. 6e describes an embodiment according to the invention of a second harmonic reflector with a different kind of electrode finger connection. Two fingers each, e.g. 31.1 and 31.2 are connected to a couple 34. The width of the gaps 32 and that of the electrode fingers is almost the same. The width of the connection (35.1 and 35.2) is not critical, but about 10 µm is preferred; however, a larger or smaller width can also be selected. Further kinds of electrode finger connections are possible.

Figure 6F:
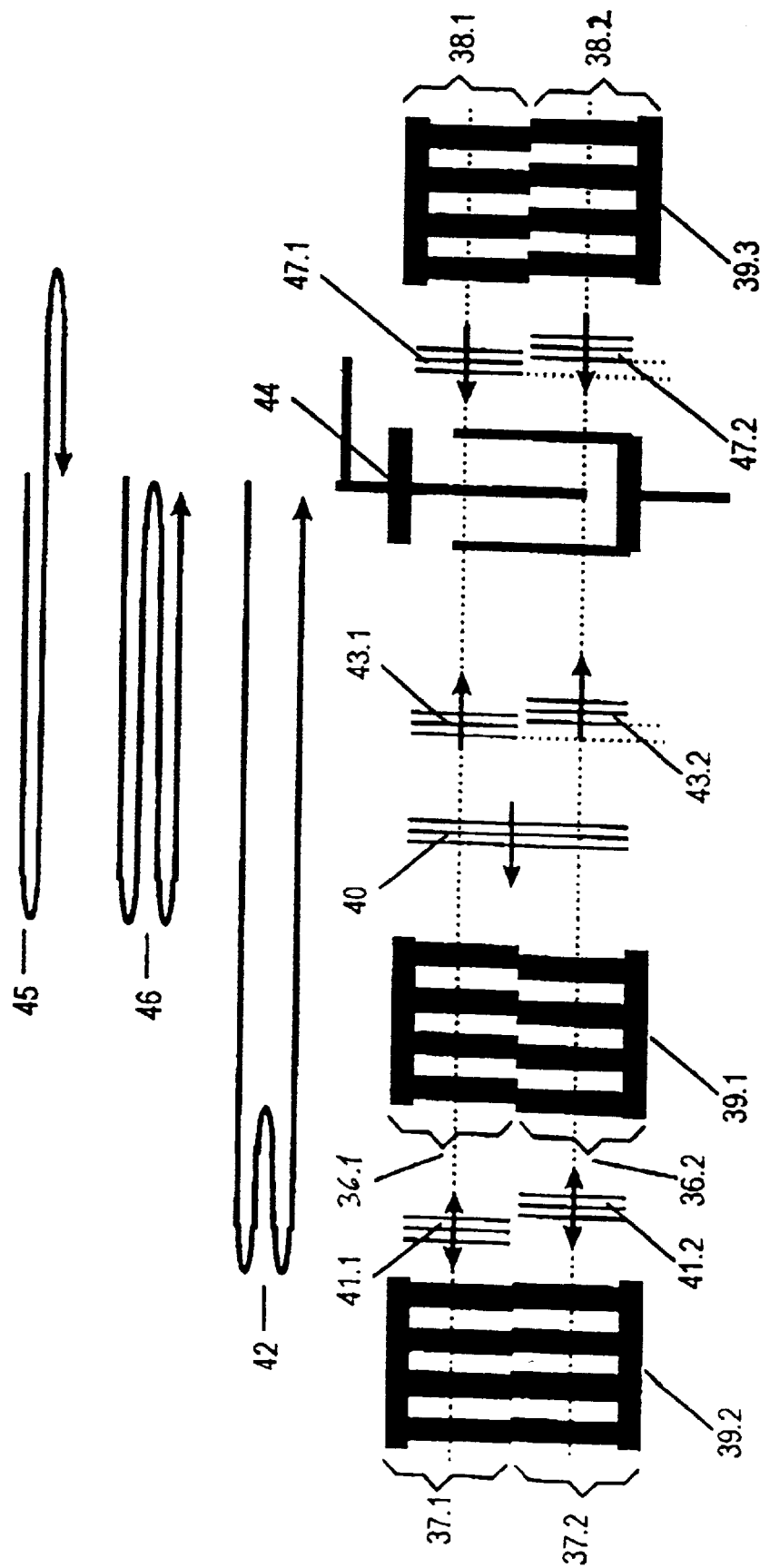
FIG. 6f an arrangement of three offset reflectors and a transducer according to the invention.

FIG. 6f shows a preferred arrangement of three offset reflectors 39.1, 39.2, 39.3.

An essential feature of the offset reflectors is that they can be divided into two approximately equal halves 36.1 and 36.2, 37.1 and 27.2, 38.1 and 38.2 as is shown in FIG. 6f, wherein one half 36.2, 37.2, 38.2 is slightly displaced with respect to the corresponding other half 36.1, 37.1, 38.1.

The amount of displacement depends on the value of a fraction of the wavelength λ. When selecting the amount of displacement it must be taken into account that if this amount is selected unfavorably the reflectivity of the offset reflector can strongly decrease for the usable signals although both halves have a high reflectivity when being considered alone. The amount of displacement as well as its direction can be different for different offset reflectors in the same layout. The right combination of these two influencing values is a particularly important feature.

An incident SAW signal 40 is divided by the offset reflector 39.1 into two signal parts 41.1 and 41.2. Part of the incident signal 40 is reflected by each half and forms a first useful signal, a further part is transmitted and reflected on the subsequent reflector 39.2. Part of the signal reflected on the reflector 39.2 is again reflected on the reflector 39.1 and leads to a disturbing multiple reflection; the other part is transmitted and forms a second useful signal.

In the present arrangement the two transmitted signal parts 41.1 and 41.2 have to pass distances having different lengths until they reach the reflector 39.2. In accordance with the invention, this distance difference is selected such that with the simple round trip reflection 42 (transmission by 39.1 reflection on 39.2 reflection on 39.1. reflection on 39.2 transmission by 39.1) a pitch difference of about λ/2 is generated between the passing-back partial signals 43.1 and 43.2. If these two partial signals meet the transducer 44, the pitch difference corresponds to a 180° phase shift of the two simultaneously arriving SAW partial signals. This causes a strong attenuation of the simple round trip disturbing signal emitted via the transponder antenna 10.

In the present arrangement an effective attenuation for the disturbing multiple reflections 45 and 46 can additionally be achieved. 45 is thus caused by the reflection on 39.1, transmission through 44, reflection on 39.2, and 46 is caused by the reflection on 39.1, reflection on 44, reflection on 39.1. The condition for an effective attenuation is that the partial signals generated by the offset reflectors, e.g. 47.1 and 47.2 of the multiple reflection 45, have a pitch difference of about λ/2. The same applies to the multiple reflection 46. The electrical excitation at the transducer 44 is considerably attenuated by the two simultaneously arriving partial signals of the multiple reflections 45 and 46, which partial signals, however, are 180° phase-shifted in accordance with the pitch difference of λ/2.

As mentioned above, FIG. 6f describes a preferred arrangement of three offset reflectors, wherein the offset reflectors 39.1, 39.2, 39.3 are each generated by second harmonic reflectors. The three reflectors are each divided into two halves, for example reflector 39.1 is divided into 36.1 and 36.2. The lower half 36.2 of reflector 39.1 is displaced by the amount Δ1, the lower half 37.2 of reflector 39.2 by the amount Δ2, and the lower half 38.2 of reflector 39.3 by the amount Δ3. The displacements Δ1, Δ2, and Δ3 can take on different amount and displacement directions.

The halves 36.2 and 37.2 are preferably not displaced in the same direction but in opposite directions. The amount of displacement is also not the same for parts 36.2 and 37.2.

According to the invention there are the following conditions for the displacements Δ1, Δ2, and Δ3, which conditions can optionally be met together or alone:

$|4*\Delta 2 - 2*\Delta 1| = \lambda/2$ (A)

$|4*\Delta 1| = \lambda/2$ (B)

$|2*\Delta 1 - 2*\Delta 3| = \lambda/2$ (C)

In accordance with the present invention, displacements in the direction of the non-reflected incident SAW signal 40 are counted positively and displacements in the opposite direction negatively. The conditions mentioned in equations (A–C) correspond to the ideal case for an exact distance difference of $\lambda/2$. However, even if there is an error of up to about 10% from $\lambda/2$, the disturbing influences are still attenuated advantageously.

Further conditions can also be formulated which, however, are mostly not very important for the use in transponders.

A preferably advantageous solution of equations (A–C) is achieved if the following displacements are selected:

$\Delta 1 = \lambda/8$ $\Delta 2 = -\lambda/16$ $\Delta 3 = -\lambda/8$

In the above embodiment displacement is thus performed such that part 36.2 is displaced by $\lambda/8$ ($\Delta 1 = \lambda/8$) in the direction of the incident SAW signal 40 and part 37.2 is displaced by $\lambda/16$ ($\Delta 2 = -\lambda/16$) in the opposite direction. For the simple round trip reflection there is, according to equation (A), a pitch difference between the two partial signals of $\lambda/2$.

By selecting $\Delta 1 = \lambda/8$ the multiple reflection 46 is additionally attenuated to a large extent and by selecting $\Delta 3 = -\lambda/8$ also the multiple reflection 45.

As a consequence of the arrangement according to the invention an additional attenuation of about 10 dB can be achieved for the disturbing reflections.

There are a number of known possibilities for realizing the transducer 44. At an operating frequency of 2.45 GHz a preferred variant is the use of an interdigital transducer with split electrode fingers which operates on the third harmonic. For a $128°$-$LiNbO_3$ substrate material there is an advantageous embodiment with about 25 split electrode fingers and a finger length of about 150 $\mu$m to 200 $\mu$m. Under this circumstances the transducer impedance is about 50 Ohms and an additional adaptation is not required.

The different embodiments can be combined with each other or can be modified. The different ways of coupling the acoustic channels can in principle be combined. Acoustic channels can be connected in parallel and in series. The arrangement of the different channel is preferably selected such that there are minimum losses, minimum space requirements and minimum internal disturbing reflexes.

What is claimed is:

1. A surface acoustic wave (SAW) element having a piezoelectric substrate for launching a surface acoustic wave into an acoustic channel, said piezoelectric surface comprising at least one interdigital transducer (IDT) arranged in a first direction on the surface of the substrate and a reflector arranged on the same surface in an interior of the acoustic channel and oriented such that the reflector reflects the surface acoustic wave in a second direction opposite to the first direction, and wherein the reflector is divided laterally with respect to the first and second directions into at least two areas which each open up a subchannel, and at least one of said two areas is offset with respect to the direction of the acoustic channel.

2. A SAW element according to claim 1, wherein the offset is about $\lambda/8$, and wherein $\lambda$ is a wavelength generated by the interdigital transducer (IDT) at a center operating frequency of the SAW element.

3. A SAW element according to claim 1, wherein the first and second areas have equal apertures.

4. A SAW element according to claim 1, wherein a double reflected echo signal is compensated due to an additional acoustic path $|\lambda/8*4| = \lambda/2$ and a corresponding phase shift of $180°$ between waves in the subchannel.

5. A SAW element according to claim 1, wherein the reflector is a calibration reflector.

6. A SAW element according to claim 1, wherein the transducer is bidirectional and is able to emit surface acoustic waves with same amplitudes to opposite directions.

7. A SAW element according to claim 6, wherein at least one further reflector is arranged in the acoustic channel at a side opposite to the transducer, wherein the further reflector is divided laterally with respect to the first and second directions into at least two areas which each open up a subchannel, and at least one of said two areas is offset with respect to the direction of the acoustic channel.

8. A SAW element according to claim 7, wherein the reflectors arranged on opposing surfaces of the interdigital transducer are divided in a lateral direction into two areas having equal apertures and one of said areas has an offset in the direction of the IDT or away from the IDT which offset is $\lambda/8$, wherein $\lambda$ is a wavelength generated by the IDT at the center operating frequency of the SAW element.

9. A SAW element according to claim 8, wherein a round-trip echo signal generated by one single reflection on two reflectors arranged on both sides of the transducer is attenuated due to a $180°$ phase shift between the surface acoustic waves propagating in the two subchannels.

10. A SAW element according to claim 7, wherein a second reflector is arranged in the acoustic channel in a greater distance from the IDT than the first reflector, wherein both reflectors are divided into two areas having an equal aperture and upper and the lower areas of the first reflector are offset by a distance $|\Delta 41|$ along the acoustic channel away from the transducer (+x direction: offset $\Delta 1 = +|\Delta 1|$ or towards the transducer (-x direction: offset $\Delta 1 = -|\Delta 1|$), whereas the corresponding area of the second reflector is offset by the distance $|\Delta 2|$.

11. A SAW element according to claim 10, wherein the offset $\Delta 1 = |\Delta 1| = \lambda/8$ and $\Delta 2 = -|\Delta 2| = -\lambda/16$.

12. A SAW element according to claim 10, wherein at least one reflector does not comprise an offset between the areas.

13. A SAW element according to claim 10, wherein the reflectors are short-circuited, or open electrodes or electrodes connected in groups and made of a metal and arranged periodically with periodic distances of $\lambda/2$, $\lambda$ or multiples of $\lambda/2$, and wherein the short-circuited electrodes may comprise additional connections.

14. A SAW element according to claim 13, comprising a plurality of transducers arranged in different acoustic channels and electrically connected with each other.

15. A SAW element according claim 14, wherein the transducers, the reflectors or both are weighted, by the number of electrodes or their aperture.

16. A SAW element according to claim 15, wherein the reflectors are suited for encoding tag data due to their position in time or a time delay value of a reflected response.

17. A SAW element according to claim 16, wherein all reflectors have an initial delay $T_{init}$ and all reflectors are arranged in a distance from the corresponding IDT which is greater than a predetermined minimum value $L_{init} = 2 \times T_{init}/v_{SAW}$, wherein $v_{SAW}$ is the velocity of the surface wave.

18. A SAW element according to claim 17, wherein in a plurality of the acoustic channels formed by the transducers one or more reflectors having a transmittance of more than 10% are placed and the reflectors generate response signals having exactly the same delay.

19. A SAW element according to claim 18, wherein at an end of an acoustic channel and close to an edge of the piezoelectric substrate there is means for preventing parasitic reverse reflections of the SAW element through the edge of the substrate, by absorption, scattering or inclined reflection of the wave.

20. A SAW element according to claim 13 wherein the electrodes are made of a metal selected from the group consisting of Al and Au and the reflectors are divided laterally perpendicular to the acoustic channel.

* * * * *